United States Patent
Takei

(10) Patent No.: US 6,233,434 B1
(45) Date of Patent: May 15, 2001

(54) SYSTEM FOR TRANSMITTING/RECEIVING A SIGNAL HAVING A CARRIER FREQUENCY BAND FOR A RADIO BASE STATION

(75) Inventor: Ken Takei, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/257,050

(22) Filed: Feb. 25, 1999

(30) Foreign Application Priority Data

Aug. 28, 1998 (JP) .................................................. 10-242863

(51) Int. Cl.[7] ................................. H04B 1/38; H04B 1/02
(52) U.S. Cl. .......................... 455/103; 455/126; 455/562
(58) Field of Search ................................ 455/84, 91, 103, 455/114, 115, 116, 126, 127, 561, 562; 330/124 R, 295

(56) References Cited

U.S. PATENT DOCUMENTS

| | | | |
|---|---|---|---|
| 5,300,894 | * 4/1994 | Myer et al. | 455/103 |
| 5,432,780 | * 7/1995 | Smith et al. | 455/562 |
| 5,724,666 | * 3/1998 | Dent | 455/562 |
| 5,758,287 | * 5/1998 | Lee et al. | 455/103 |
| 5,790,517 | * 8/1998 | Meredith | 455/103 |
| 5,806,001 | * 9/1998 | Yokota | 455/562 |
| 5,848,361 | * 12/1998 | Edwards | 455/562 |
| 5,854,986 | * 12/1998 | Dorren et al. | 455/562 |
| 5,903,826 | * 5/1999 | Nowak | 455/562 |
| 5,912,927 | * 5/2000 | Smith et al. | 455/103 |
| 6,058,105 | * 5/2000 | Hochwald et al. | 455/103 |

FOREIGN PATENT DOCUMENTS

| | | |
|---|---|---|
| 10-200322 | 7/1998 | (JP) . |
| 10-229362 | 8/1998 | (JP) . |

* cited by examiner

*Primary Examiner*—May Maung
(74) *Attorney, Agent, or Firm*—Mattingly, Stanger & Malur, P.C.

(57) ABSTRACT

In a system for feeding electric power having a carrier band for a mobile communication base station including transmission power amplifiers and an array antenna, a transmission/reception system is capable of reducing a large loss which the transmission electric power suffers until the transmission electric power having a large output has been radiated into the air, and increase in the power consumption. The system includes a plurality of transmission/reception signal amplifying devices, which are respectively coupled to a plurality of antennas, in each of which a feed forward power amplifier which is realized with less electric power than the total electric power which is to be radiated from the associated antenna into the air, and a low noise amplifier are respectively coupled to the associated antennas through a transmission filter and a reception filter, wherein an output of a power detector connected to an output portion of the feed forward power amplifier is compared with a control signal of a tilt angle control circuit to adjust, every feed forward amplifier, the phase shift amount of a variable phase shift circuit inserted into an output portion of the feed forward power amplifier while referring to a phase shift amount table which is constructed on the basis of the characteristics of the feed forward circuit.

30 Claims, 17 Drawing Sheets

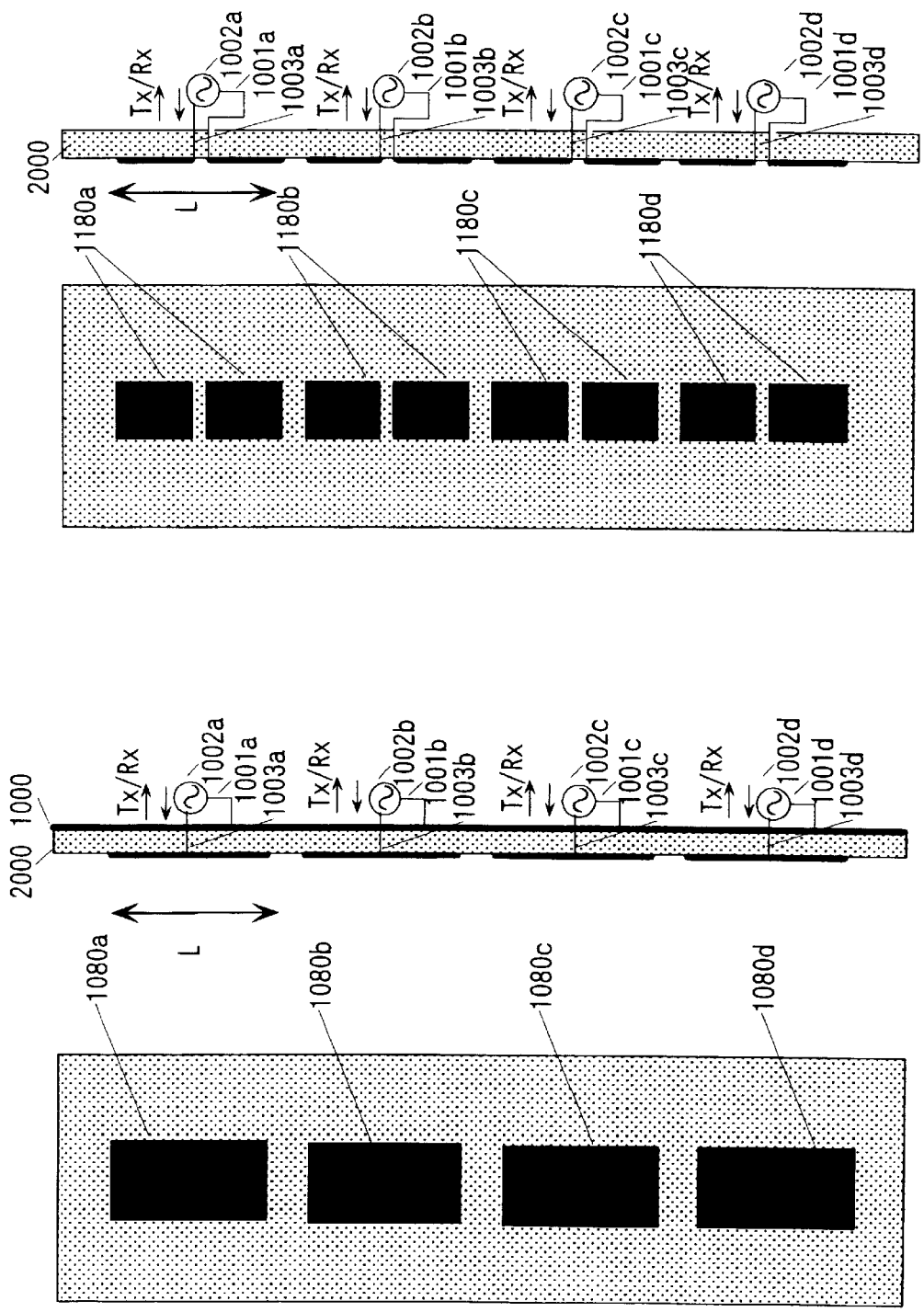

SYSTEM FOR TRANSMITTING/RECEIVING A SIGNAL HAVING A CARRIER FREQUENCY BAND FOR A RADIO BASE STATION

BACKGROUND OF THE INVENTION

The present invention relates in general to a system for transmitting/receiving an electrical signal, and more particularly to a system for transmitting/receiving a signal having a carrier frequency band for a radio base station.

In mobile communication of carrying out the communication utilizing an electromagnetic wave, in order that the limited frequencies may be repeatedly used at high efficiency and also the capacity of subscribers which are accommodated by a system may be increased, there is employed a method, called the cellular method, wherein the range of an electromagnetic wave which has been radiated from one base station is focused by sharpening the directivity of an antenna and the same frequency is spatially reutilized. In the current method, from the demand for miniaturization of the terminals, the information transmission amount which is required by the system, and the spatial attenuation characteristics of an electromagnetic wave, in the cellular mobile communication system, the range of the electromagnetic wave which has been radiated from a base station is in the range of about several km to about 20 km, the used frequency is in the range of several hundreds MHz to several GHz, and the radiation power of one terminal is in the range of several hundreds mW to about several W. Under such circumstances, in order that one base station may support the subscribers of several tens to several hundreds, the mean transmission electric power of several tens W to several hundreds W is required for the output of a transmission power amplifier of the base station. In addition, in order to realize the various communication services, currently, the mobile communication system for which the digital communication method is adopted is the main current. In this case, since the modulation method becomes the phase/amplitude modulation, the high linearity is required for the transmission power amplifier, and since the non-linearity of a semiconductor device used to realize that power amplifier needs to be compensated for, in general, the efficiency of the power amplifier of interest can not be enhanced, and the saturation output of several hundreds W to several kW is required for the power amplifier of interest. Then, it is desirable that the transmission power amplifier of the base station is installed in the vicinity of the associated antenna. If the electric power is supplied from the transmission power amplifier installed adjacent to an indoor base station at more than ten meters above the ground to the antenna which is installed at the height of 100 m, normally, the electric power loss of about 5 to about 6 dB occurs due to the loss of a high frequency cable such as a coaxial cable through which the antenna is connected to the transmission power amplifier. In order to compensate therefor, the output of the transmission power amplifier needs to be increased by about 5 times.

On the other hand, in order that the electromagnetic wave which has been radiated from a base station may be focused within a service area of one base station, the large gain is required for the antenna. In order that the transmission output may be focused within the service area having a diameter of about several m to about 10 km as in the current cellular system, the antenna gain of about 10 dBi to about 16 dBi is required. The gain of the antenna which can be realized by a single element is about 2 dBi, and hence in order to realize the larger gain of 10 dBi to 16 dBi, the technology, for an array antenna, of arranging a plurality of such single elements to increase the gain is required. In order to realize the gain of about 10 to about 16 dBi, the array in which eight to twelve single elements are arranged is required. In addition, in the normal operation of the system, by adjusting the area for which the base station provides the service, i.e., the area within which the electromagnetic wave is focused along with increase or decrease of the number of subscribers, the frequency utilizing efficiency of the overall system is enhanced. For this reason, the main beam of the antenna which is applied to the base station needs to be tilted downwardly and also the function of changing the tile angle is required.

SUMMARY OF THE INVENTION

In order to fulfill the demand for increasing the output power of the above-mentioned transmission power amplifier and the demand for increasing the gain of the antenna, in the prior art, for the former demand, the combining device is employed which utilizes the mode coupling of the electric power as the proximity operation, such as the combining circuit or the combiner for which a plurality of power amplifiers or a plurality of semiconductor amplifying devices used in the power amplifiers are prepared, thereby carrying out the power electric combining. Since a large amount of electric power is concentrated in the small space, and also since the proximity effect is utilized, in terms of necessity of ensuring the isolation between a plurality of input terminals of the combining circuit, those devices bring the loss in the power combining, and since the loss is increasing as increase in the number of combining, the efficiency of the overall power amplifier is degraded. This is a problem. In addition, for the latter demand, since in order to attain the large gain, a plurality of antennas are coupled to one another with the fixed phase relation while maintaining the impedance matching, the line through which the element antennas are coupled is increased, and as a result, the loss is also increased. This is another problem. For example, if the array in which ten element antennas are arranged is taken as an example, since in the normal array antenna, the spacing between the base elements is about 0.5 to about 1.0 wavelength, when ten elements are coupled to one another by the tournament method, the loss for 4 to 5 wavelength is measured for one basic element. In addition, in order to make the beam tilt angle of the antenna variable, the variable phase shifter needs to be inserted between the transmission power amplifier and the antenna. Then, since the output power of the transmission power amplifier is very large, the loss in the phase shifter can not be disregarded.

As described above, in the carrier band power feeding system for the mobile communication base station employing the transmission power amplifier and the array antenna according to the prior art, there arises the problem that the loss which the transmission electric power undergoes is large until the transmission electric power having the large output has been radiated to the space, and hence the efficiency of the carrier band power feeding system is degraded to cause increase in the power consumption.

In the light of the foregoing, the present invention was made in order to solve the above-mentioned problems associated with the prior art, and it is therefore an object of the present invention to provide, in a carrier band power feeding system for a communication base station including transmission power amplifiers and antennas, a system for transmitting/receiving an electrical signal which is capable of reducing the loss in the transmission electric power and the increase in the power consumption until the transmission electric power having the large output has been radiated to the space.

According to one aspect of the present invention, there is provided a system for transmitting/receiving an electrical signal, the system including: a plurality of transmission/reception signal amplifying devices each having a power amplifier, a variable phase shift circuit connected to an input portion of the power amplifier, a power detector connected to an output portion of the power amplifier, and a phase shifting amount table which is constructed on the basis of the characteristics of the power amplifier; a plurality of antennas which are respectively connected to the transmission/reception signal amplifying devices; and a tilt angle control circuit which is connected to the transmission/reception signal amplifying devices, wherein each of the outputs of the power detectors is compared with a control signal of the tilt angle control circuit to adjust the phase shifting amount of the variable phase shifting circuits on the basis of the contents of the phase shifting amount table. In particular, the power amplifier is constituted by a feed forward amplifier in which a linear amplifier can be realized efficiently using a semiconductor device which has originally the non-linearity; the feed forward power amplifier is constructed with the less power for the overall electromagnetic power which is to be radiated from the associated antenna into the space; the feed forward power amplifier having the small output and a low noise amplifier are coupled to each other through a transmission filter and a reception filter by an antenna and a branch circuit in such a way that a common branch is coupled to the antenna; the power detector is provided in a final output portion of the feed forward amplifier; the output of the power detector is compared with the control signal of the tilt angle control circuit to adjust, every feed forward amplifier, the phase shifting amount of the variable phase shift circuit connected to the input portion of the feed forward amplifier while referring to the phase shifting amount table which is previously constructed on the basis of the characteristics of the feed forward amplifiers; and on the basis of the time domain adaptive phase control characteristics of the feed forward amplifier, the output phase relation between the feed forward amplifiers is automatically held constant, and the transmission outputs from the antennas which are spatially coupled to the feed forward amplifiers are spatially combined with respect to the required beam tilt direction, and also the electromagnetic waves coming from the required beam tilt direction are spatially combined to be supplied to the low noise amplifier through the branch circuit and the reception filter.

With respect to the feed forward amplifier as the constituent element of the above-mentioned means, on the basis of the compatibility in specification between the linearity of the main amplifier which is included as the constituent element by the feed forward amplifier and the linearity of the system demand in terms of the overall feed forward amplifier, the number of loop multiplexes is determined. In this connection, if the specification of the current cellular base station is taken into consideration, it is desirable that the number of loop multiplexes is one or two. A variable phase shifter and variable attenuator as another constituent element of the feed forward amplifier is realized by cascade-connecting a normal variable phase shifter and a normal variable attenuator. With respect to the feed forward amplifier which is applied to the present invention, in the case where the number of loop multiplexes is two, an input terminal of a third splitter is coupled to a transmission signal input terminal of the feed forward amplifier; an input terminal of a first splitter is coupled to a first output terminal of the third splitter through a third variable phase shifter and variable attenuator; an input terminal of a first amplifier is coupled to a first output terminal of the first splitter through a first variable phase shifter and variable attenuator; an input terminal of a second splitter is coupled to an output terminal of the first amplifier; a first input terminal of a second combiner is coupled to a first output terminal of the second splitter through a second delay line; an output terminal of the second combiner is coupled to a first input terminal of a fourth splitter; an output terminal of the fourth splitter is coupled to a first input terminal of a fourth combiner through a fourth delay line; an output terminal of the fourth combiner is coupled to the transmission signal output terminal of the feed forward amplifier; a second input terminal of the fourth combiner and an output terminal of a third amplifier are coupled to each other; an input terminal of the third amplifier and an output terminal of a third combiner are coupled to each other through a fourth variable phase shifter and variable attenuator; a second input terminal of the third combiner and a second output terminal of a fourth splitter are coupled to each other; a first input terminal of the third combiner and a second output terminal of the third splitter are coupled to each other through a third delay line; a second input terminal of the second combiner and an output terminal of a second amplifier are coupled to each other; an input terminal of the second amplifier and an output terminal of a first combiner are coupled to each other through a second variable phase shifter and variable attenuator; a second input terminal of the first combiner and a second output terminal of a second splitter are coupled to each other; and a first input terminal of the first combiner and a second output terminal of a first splitter are coupled to each other through a first delay line, wherein by referring to an output signal of the second combiner, an output signal of the fourth combiner, an output signal of the first combiner, and an output signal of the third combiner, the phase shift/attenuation amount of the second variable phase shifter and variable attenuator, the fourth variable phase shifter and variable attenuator, the first variable phase shifter and variable attenuator and the third variable phase shifter and variable attenuator are controlled. In the case where the number of loop multiplexes is one, in constract with the case where the number of loop multiplexes is two, the third and fourth combiners, splitters, delay lines and variable phase shifters and variable attenuators are removed, and hence the transmission signal output terminal and the transmission signal input terminal are directly coupled to the input terminal of the first splitter and the output terminal of the fourth combiner, respectively.

When adopting a microstrip antenna and a printed dipole antenna, the antennas which are coupled to the branch circuit are installed in such a way that the center lines vectors of the current distribution as the base of the operation of each of the antennas are arranged in the same straight line. In the antennas arranged in such a way, for the main polarization, the radiation directivity of the radio wave for the direction of presence of other two antennas adjacent to one antenna becomes null, and the spread of the electromagnetic wave having the polarization into the adjacent antennas is remarkably suppressed. For other antennas which have not the adjacent relation, likewise, the spread of the electromagnetic wave having the polarization is also remarkably suppressed. On the other hand, since in the direction in which the outputs of the antennas are to be combined, no null point occurs, for the direction of the normal to the plane conductor constituting the microstrip antenna and the printed dipole antenna or for the direction deviated from the normal by an angle of about 10 degrees, the total loss is only the transmission loss through the space and is very low, and hence the power combining is realized with the combining loss which can be disregarded in the frequency band which is employed in the current cellular radio system. In the case where the slot antennas are employed as the antennas coupled to the branch circuit, those antennas are installed in such a way that the vector center lines of the magnetic current distribution as the base of the operation of each of the antennas or the vector center lines of the magnetic current distribution of the center portions when viewing longitudinally the slots are arranged in the same straight line. As a result, the power combining is realized with the combining loss which can be disregarded similarly to the case where the microstrip antennas are employed for the antennas coupled to the branch circuit.

In the case where the specifications for the gains of the antennas are the same and the large area for forming the antennas is taken, the output of the feed forward amplifier is directly coupled to the transmission antenna through the transmission filter, the reception antenna is directly coupled to the low noise amplifier through the reception filter, and in the case of the microstrip antennas, the printed dipole antennas and the slot antennas as described above, the transmission antenna and the reception antennas are alternately installed in such a way that the corresponding center lines of the antennas are arranged in the same straight line. In this case, since the isolation between the adjacent antennas can be sufficiently obtained, as compared with the case where the same antenna serves both as the transmission antenna and the reception antenna, it is possible to the more reduce the amount of out of band attenuation of the transmission filter and the reception filter.

When the system to which the present invention is applied requests the diversity reception, with respect to an antenna used both as a transmission antenna and a reception antenna which is coupled the feed forward power amplifier by the branch circuit through the transmission filter in such a way that the common branch is coupled to the associated antenna, and a reception dedicated antenna which is coupled the low noise amplifier through the reception filter and also another low noise amplifier and another reception filter, the transmission/reception antenna is realized by utilizing a microstrip antenna or a printed dipole antenna, and the reception dedicated antenna is realized by utilizing a slot antenna, or the transmission/reception antenna is realized by utilizing a slot antenna and the reception dedicated antenna is realized by utilizing a microstrip antenna or a printed dipole antenna. In this connection, the transmission/reception antennas and the reception dedicated antennas are alternately installed in such a way that the corresponding center lines of the antennas are arranged in the same straight line. In this case, since the transmission/reception antennas and the reception dedicated antennas form the null points in the direction of presence of the other antennas, the sufficiently large isolation between the adjacent antennas, and between antenna of interest and other antennas can be obtained. Also, since the direction of polarization of the slot antenna intersects perpendicularly the direction of polarization of the microstrip antenna or the printed dipole antenna, the polarization diversity function can be realized by the present construction.

In the case where the system to which the present invention requests the diversity reception, the specification of the out of band attenuation characteristics of the transmission filter and the reception filter are severe and the large area in which the antennas are formed is obtained, the output of the feed forward amplifier is directly coupled to the transmission antenna through the transmission filter; the reception antenna is directly coupled to the low noise amplifier through the reception filter; the second reception antenna is directly coupled to the second low noise amplifier through the second reception filter; the transmission antenna is constituted by the first microstrip antenna or the first printed dipole antenna; the first reception dedicated antenna is constituted by the second microstrip antenna or the second printed dipole antenna; the second reception dedicated antenna is constituted by the slot antenna or the transmission antenna is constituted by the first slot antenna; the first reception dedicated antenna is constituted by the second slot antenna; and the second reception dedicated antenna is constituted by the microstrip antenna or the printed dipole antenna, wherein the first reception antennas and the second reception antennas are installed in parallel with each other in such a way that the center lines of the magnetic current distribution of the center portions become parallel with each other along the longitudinal direction of the center lines of the current distribution and the slots, and also the grouped antennas in which the two antennas are arranged in parallel and the transmission antennas are alternately installed in such a way that the center line which lies half-way between the two center lines of the grouped antennas and which extends in the same direction as that of the two center lines thereof, and the center line of the transmission antenna are disposed in the same straight line. Since the main polarization directions of the two antennas forming the antenna group intersect perpendicularly each other, the mutual interference therebetween is suppressed to the low level. Also, since one antenna of the antenna group and the transmission antenna form the null point in the direction of presence of the other antenna, the isolation between the adjacent antennas and between the antenna of interest and other antennas can be sufficiently ensured. Therefore, the diversity reception can be made possible, while relaxing the out of band attenuation amount of the transmission and reception filters, by the present construction.

BRIEF DESCRIPTION OF THE DRAWINGS

Other objets, features and advantages of the present invention will become apparent from the following detailed description of the embodiments of the invention taken in conjunction with the accompanying drawings, wherein:

FIG. 11 is a front view and a cross sectional view showing the construction of antennas as constituent elements of an embodiment of a system for transmitting/receiving a signal having a carrier frequency band for a radio base station according to the present invention;

FIG. 12 is a front view and a cross sectional view showing the construction of antennas as constituent elements of another embodiment of a system for transmitting/receiving a signal having a carrier frequency band for a radio base station according to the present invention;

DETAILED DESCRIPTION OF THE PREFERRED EMBODIMENTS

The preferred embodiments of the present invention will hereinafter be described in detail with reference to the accompanying drawings.

Figure 1:
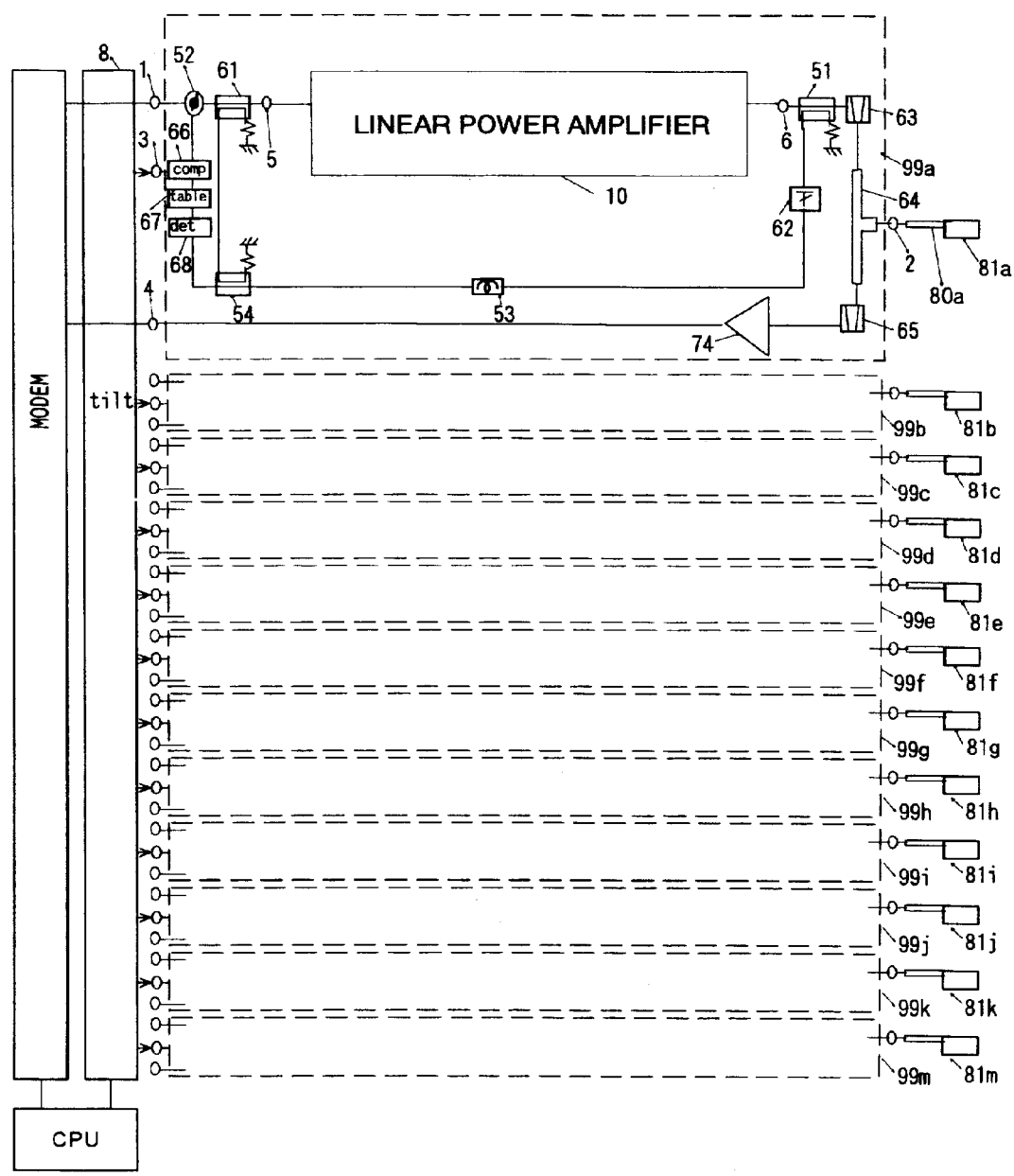
FIG. 1 is a block diagram, partly in circuit diagram, showing a configuration of an embodiment of a system for transmitting/receiving a signal having a carrier frequency band for a radio base station according to the present invention.

FIG. 1 is a block diagram, partly in circuit diagram, showing a configuration of an embodiment of a system for transmitting/receiving a signal having a carrier frequency band for a radio base station according to the present invention. In the system shown in the block diagram of FIG. 1, an input signal terminal of a fifth variable phase shifter 52 is coupled to a transmission signal input terminal 1 through which a transmission signal from a modulator and demodulator (a MODEM) of a signal transmitting apparatus is received; subsequently, a sixth splitter 61 is coupled to a linear amplifier input terminal 5; an input terminal of a linear power amplifier 10 is coupled to a first output terminal of the sixth splitter 61; an output terminal of the linear power amplifier 10 is coupled to an input terminal of a fifth splitter 51 at a linear amplifier output terminal 6; a first output terminal of the fifth splitter 51 is coupled to one branch of a branch circuit 64 through a transmission filter 63; a first antenna 81 is coupled to a common branch of the branch circuit 64 at a transmission/reception signal input/output terminal 2 through an antenna power feeding conductor 80; an input terminal of a fourth amplifier 74 is coupled to the other branch of the branch circuit 64 through a reception filter 65; a reception signal output terminal 4 which is connected to the modulator and demodulator of the apparatus for transmitting/receiving a signal is coupled to an output terminal of the fourth amplifier 74; a fifth delay line 53 is coupled to a second output terminal of a fifth splitter 51 through an attenuator 62; subsequently, a first input terminal of a fifth combiner 54 is coupled thereto; a second input terminal of the fifth combiner 54 is coupled to a second output terminal of a sixth splitter 61; an output terminal of the fifth combiner 54 is coupled to an input terminal of a table reference circuit 67 through a signal detection circuit 68; an output terminal of the table reference circuit 67 is coupled to a first input terminal of a comparison circuit 66; and a tilt angle control signal outputted from a tilt angle control circuit 8 is inputted to a second input terminal 3 of the comparison circuit 66. In such a way, one device 99 for amplifying automatically, linearly a phase shift control transmission/reception signal is configured. In this connection, the twelve devices 99 which are discriminated by adding suffixes a to k and m thereto are installed in parallel with one another. In addition, the tilt angle control circuit 8 is coupled to each of the tilt angle control signal input terminals 3 of the twelve automatic phase shift control linear transmission/reception signal amplifying devices 99a to 99k and 99m in such a way that the circuit 8 supplies the control signal to each of the tilt angle control signal input terminals 3. Then, the embodiment shown in FIG. 1 is compared with the prior art example shown in FIG. 2. As compared with the conventional radio frequency transmitting/receiving system for a cellular base station (refer to FIG. 2) wherein a linear amplifier input terminal 5, a transmission/reception signal input/output terminal 2 and a reception signal output terminal 4 which are included in the embodiment shown in FIG. 1 are made external output terminals; a conventional feed forward amplifier in which a linear amplifier output terminal 6 is directly coupled, without through the fifth splitter 51, to a transmission filter 63 and a low noise amplifier are coupled at a duplexer including a branch circuit 64, a transmission filter 63 and a reception filter 65; a power distribution circuit 90 is coupled to a transmission/reception signal input/output terminal 2 as the common input/output terminal of the duplexer; first high frequency cables 92 are coupled to branches of the power distribution circuit 90, respectively; subsequently, variable phase shifters 93 are coupled thereto; subsequently, second high frequency cables 94 are coupled thereto; and subsequently, the second high frequency cables 94 are coupled to first antennas 81 as twelve element antennas, which constitute the array antenna and which are discriminated by suffixes a to k and m added thereto, through tournament distribution power feeding circuits 95, in the embodiment shown in FIG. 1, the large electric power which is supplied from the main amplifier of the feed forward amplifier can be radiated into the air without suffering the combining loss for ensuring the isolation of each input/output terminal of the transmission line system combiner such as a coupler, without suffering the loss when the large electric power passes through the variable phase shifter for the beam tilt, and without suffering the transmission loss of the transmission line system distributor for feeding distributively the large electric power to each of the element antennas of the array antenna in order to realize the high antenna gain, and also the energy of the electromagnetic wave coming from the air can be transmitted to the reception signal output terminal without suffering each of the losses as described above. As a result, it is possible to enhance the power efficiency of the system for transmitting/receiving a signal having a carrier frequency band for a radio base station and hence the miniaturization and the promotion of the low power consumption of the system can be attained.

Figure 3:
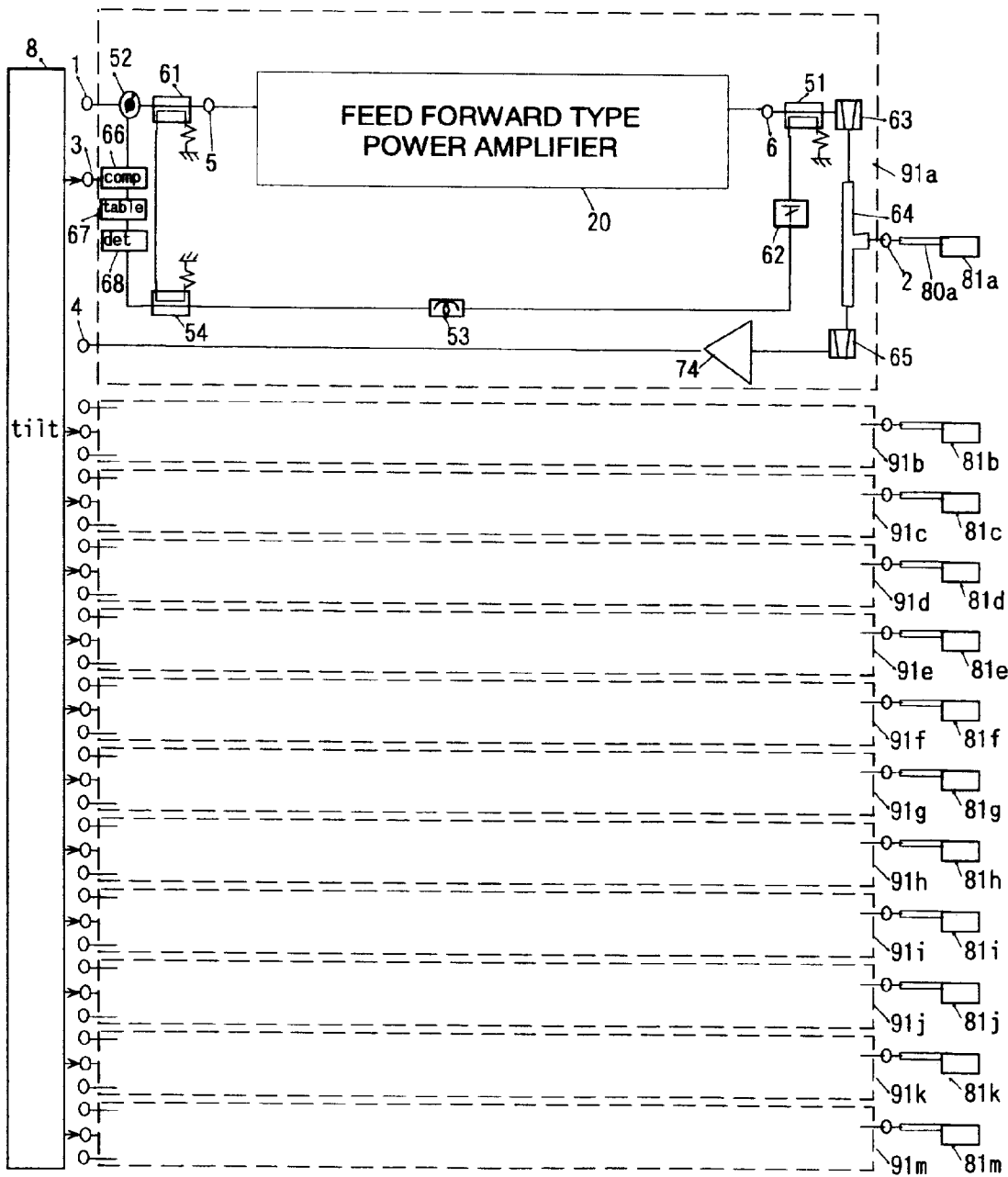
FIG. 3 is a block diagram, partly in circuit diagram, showing a configuration of another embodiment of a system for transmitting/receiving a signal having a carrier frequency band for a radio base station according to the present invention.

FIG. 3 is a block diagram, partly in circuit diagram, showing a configuration of another embodiment of a system for transmitting/receiving a signal having a carrier frequency band for a radio base station according to the present invention. A point of difference of the present embodiment from the above-mentioned embodiment shown in FIG. 1 is that the linear power amplifiers 10 of the embodiment shown in FIG. 1 are replaced with feed forward type amplifiers 20 and the automatic phase shift control transmission/reception signal linear amplifying devices 99 having as the constituent elements the linear power amplifiers 10 of FIG. 1 are replaced with the automatic phase shift control feed forward transmission/reception signal amplifying devices 91 having as the constituent elements the feed forward type amplifiers 20. According to the present embodiment, since the phase of the high frequency signal which is applied to a plurality of first antennas 81 can be controlled with very high accuracy, the efficiency of combining spatially the electric power by the plurality of first antennas 81 can be enhanced, and also the reduction of the power consumption in the system for transmitting/receiving a signal having a carrier frequency band for a radio base station resulting from the enhancement of the gain of the antenna system can be realized.

Figure 2:
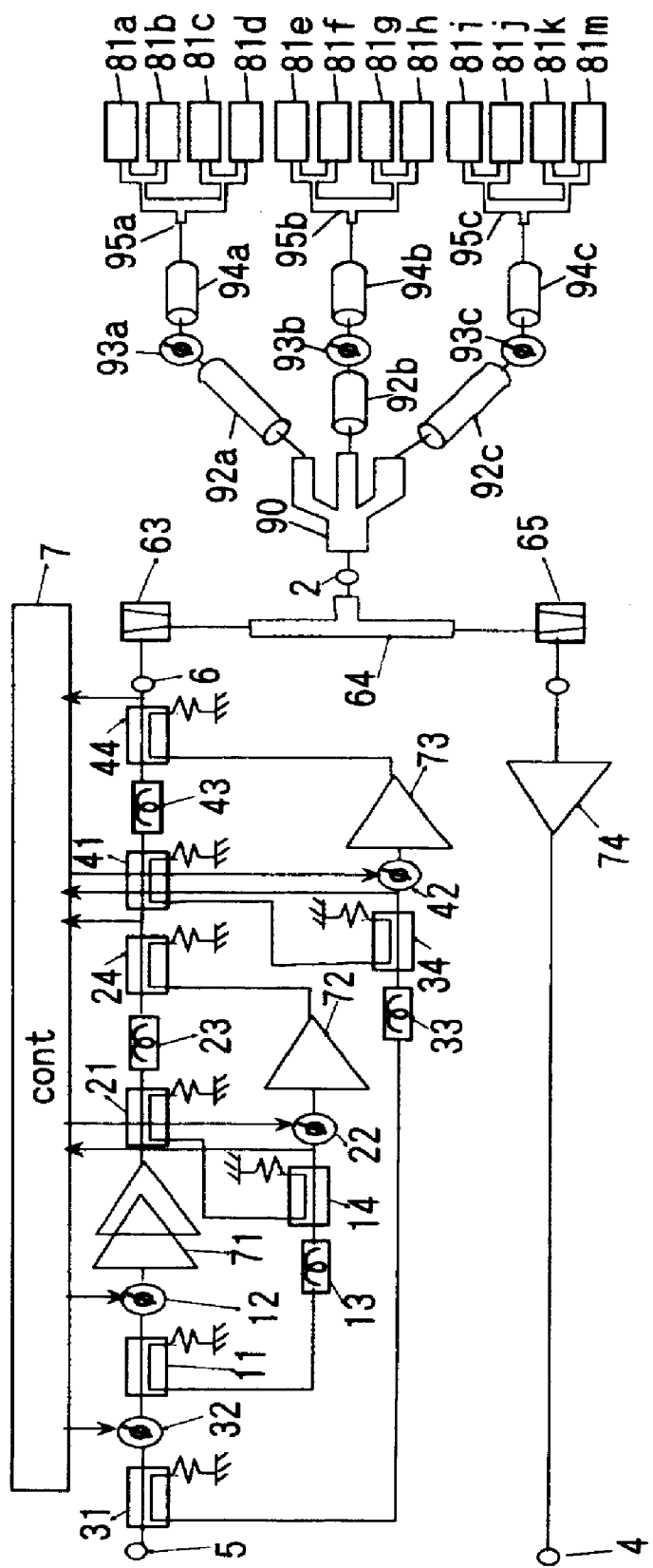
FIG. 2 is a block diagram, partly in circuit diagram, showing a configuration of an example of a system for transmitting/receiving a signal having a carrier frequency band for a radio base station according to the prior art.
Figure 4:
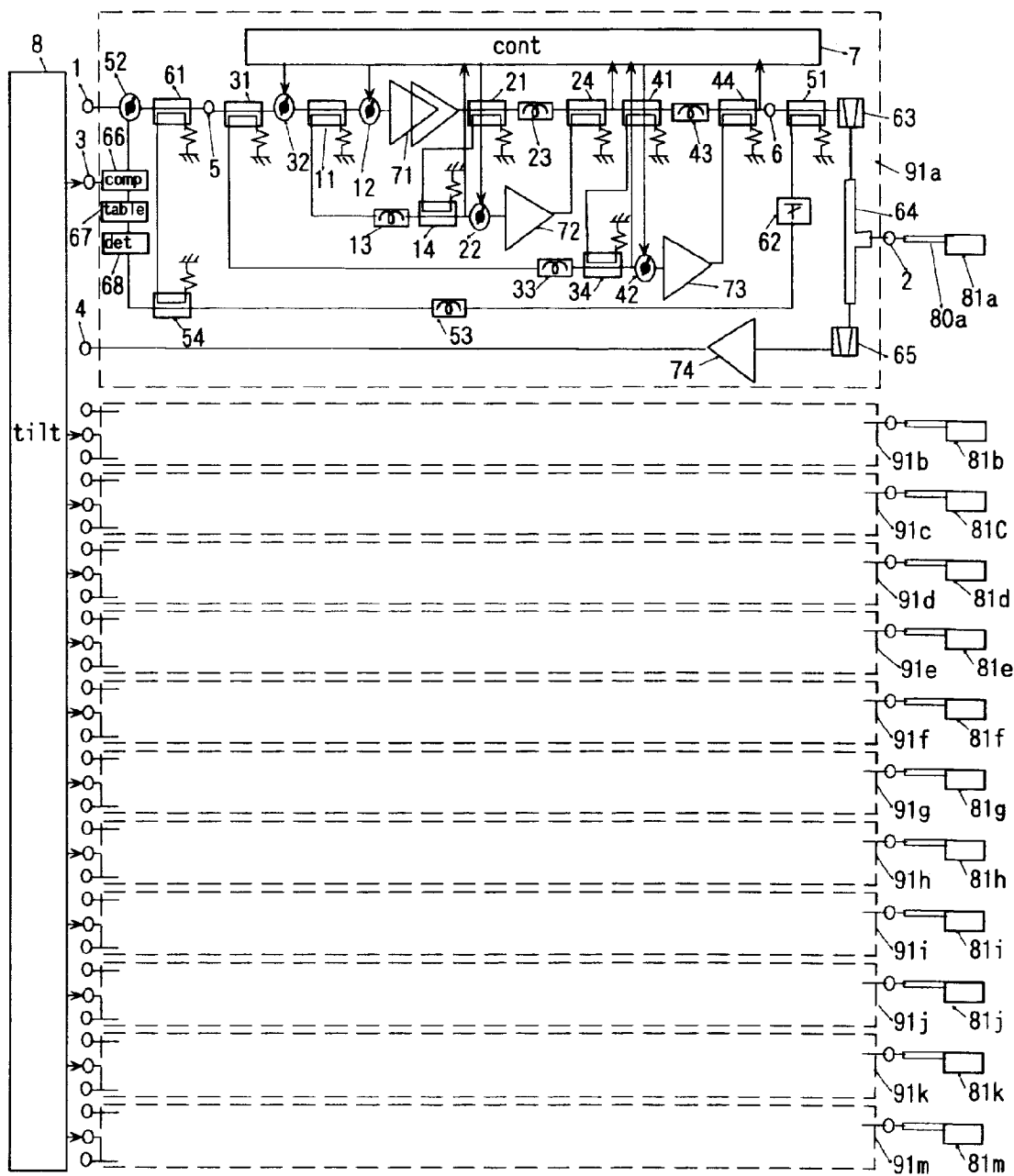
FIG. 4 is a block diagram, partly in circuit diagram, showing a configuration of still another embodiment of a system for transmitting/receiving a signal having a carrier frequency band for a radio base station according to the present invention.

FIG. 4 is a block diagram, partly in circuit diagram, showing a configuration of still another embodiment of a system for transmitting/receiving a signal having a carrier frequency band for a radio base station according to the present invention. In the system shown in the block diagram of FIG. 4, the twelve automatic phase shift control feed forward transmission/reception signal amplifying devices 91 are installed in parallel with one another in each of which an input signal terminal of a variable phase shifter 52 is coupled to a transmission signal input terminal 1; subsequently, a sixth splitter 61 is coupled thereto; an input terminal of a third splitter 31 is coupled to a first output terminal of the sixth splitter 61 at a feed forward amplifier input terminal 5; an input terminal of a first splitter 11 is coupled to a first output terminal of the third splitter 31 through a third variable phase shifter and variable attenuator 32; an input terminal of a first amplifier 71 is coupled to a first output terminal of the first splitter 11 through a first variable phase shifter and variable attenuator 12; an input terminal of a second splitter 21 is coupled to an output terminal of the first signal amplifier 71; a first input terminal of a second combiner 24 is coupled to a first output terminal of the second splitter 21 through a second delay line 23; an output terminal of the second combiner 24 is coupled to a first input terminal of a fourth splitter 41; an output terminal of the fourth splitter 41 is coupled to a first input terminal of a fourth combiner 44 through a fourth delay line 43; an output terminal of the fourth combiner 44 is coupled to an input terminal of a fifth splitter 51 at the feedforward amplifier output terminal 6; a first output terminal of the fifth splitter 51 is coupled to one branch of a branch circuit 64 through a transmission filter 63; a first antenna 81a is coupled to a common branch of the branch circuit 64 at a transmission/reception signal input/output terminal 2 through an antenna power feeding conductor 80a; an input terminal of a fourth amplifier 74 is coupled to the other branch of the branch circuit 64 through a reception filter 65; a reception signal output terminal 4 is coupled to an output terminal of the fourth amplifier 74; a fifth delay line 53 is coupled to a second output terminal of the fifth splitter 51 through an attenuator 62; subsequently, a first input terminal of a fifth combiner 54 is coupled thereto; a second input terminal of the fifth combiner 54 is coupled to a second output terminal of a sixth splitter 61; an output terminal of the fifth combiner 54 is coupled to an output terminal of a table reference circuit 67 through a signal detection circuit 68; an output terminal of the table reference circuit 67 is coupled to a first input terminal of a comparison circuit 66; a second output terminal of the comparison circuit 66 is an input terminal 3 through which a control signal from a tilt angle control circuit 8 is inputted; a second input terminal of a fourth combiner 44 is coupled to an output terminal of a third amplifier 73; an input terminal of the third amplifier 73 is coupled to an output terminal of a third combiner 34 through a fourth variable phase shifter and variable attenuator 42; a second input terminal of the third combiner 34 is coupled to a second output terminal of a fourth splitter 41; a first input terminal of the third combiner 34 is coupled to a second output terminal of a third splitter 31 through a third delay line 33; a second input terminal of a second combiner 24 is coupled to an output terminal of a second amplifier 72; an input terminal of the second amplifier 72 is coupled to an output terminal of a first combiner 14 through a second variable phase shifter and variable attenuator 22; a second input terminal of the first combiner 14 is coupled to a second output terminal of a second splitter 21; a first input terminal of the first combiner 14 is coupled to a second output terminal of a first splitter 11 through a first delay line 13; and a feed forward control circuit 7 is provided which serves to refer to an output signal of the second combiner 24, an output signal of the fourth combiner 44, an output signal of the first combiner 14, and an output signal of the third combiner 34 in order to control the phase shift/attenuation amount of the second variable phase shifter and variable attenuator 22, the fourth variable phase shifter and variable attenuator 42, the first variable phase shifter and variable attenuator 12, and the third variable phase shifter and variable attenuator 32, and each of which has the feed forward control circuit 7 as the constituent element and which are discriminated on the basis of suffixes a to k and m added thereto. In addition, the tilt angle control circuit 8 for supplying a tilt angle control signal to a tilt angle control signal input terminal 3 of each of the twelve automatic phase shift control feed forward transmission/reception signal amplifying devices 91a to 91k and 91m is coupled to those devices 91a to 91k and 91m. In this connection, the comparison result of the embodiments shown in FIGS. 3 and 4 with the prior art shown in FIG. 2 is the same as that of the first embodiment shown in FIG. 1 with the prior art. The embodiments of FIGS. 3 and 4 have the effect originated from the feed forward amplifier.

Figure 5:
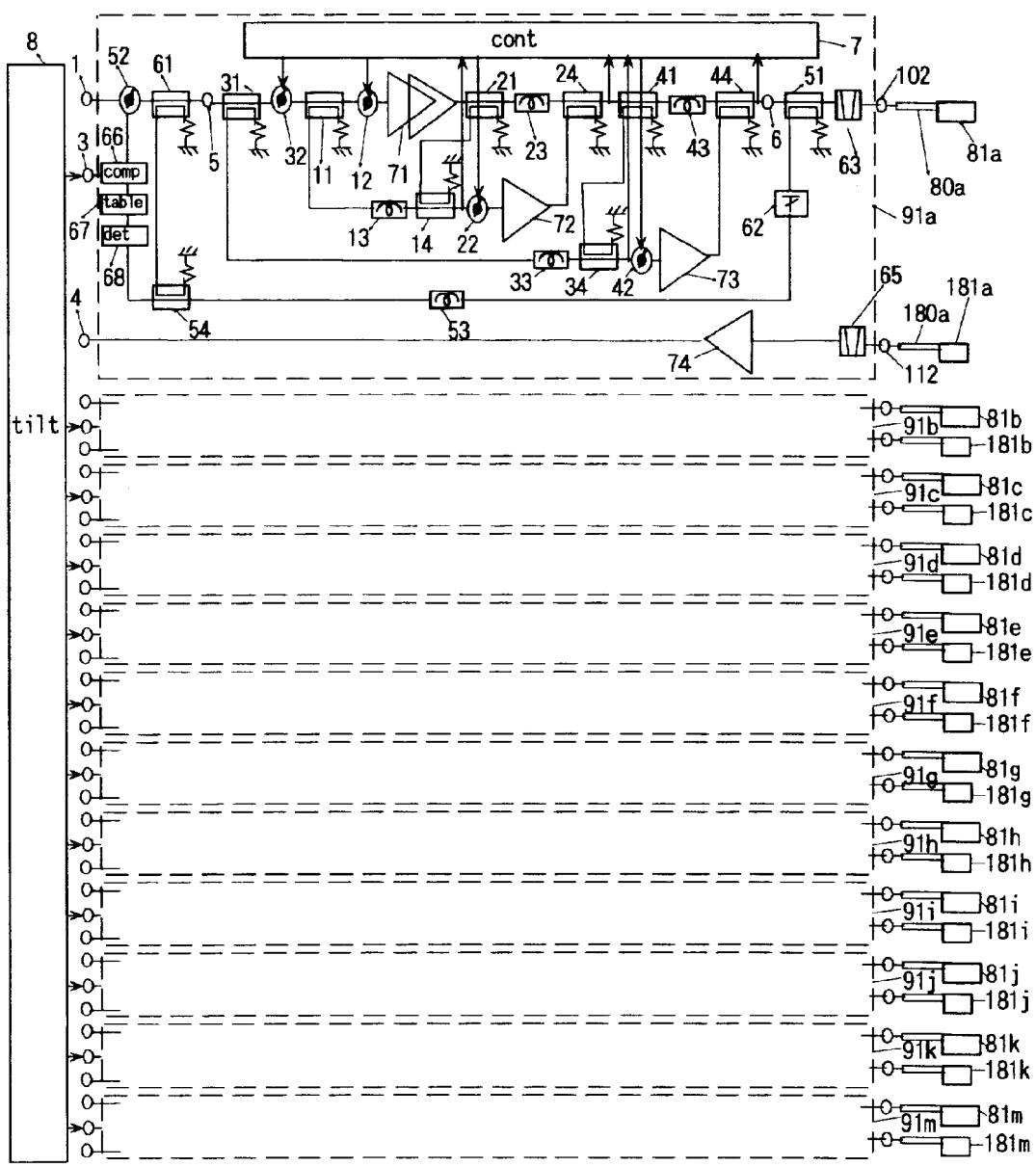
FIG. 5 is a block diagram, partly in circuit diagram, showing a configuration of yet another embodiment of a system for transmitting/receiving a signal having a carrier frequency band for a radio base station according to the present invention.

FIG. 5 is a block diagram, partly in circuit diagram, showing a configuration of yet another embodiment of a system for transmitting/receiving a signal having a carrier frequency band for a radio base station according to the present invention. A point of difference of the present embodiment from the embodiment shown in FIG. 4 is that for the amplifying devices 91a to 91k and 91m, the branch circuit 64 of the embodiment shown in FIG. 4 is removed and the output terminal of the transmission filter 63 is directly coupled to the first antenna 81 at the transmission power output terminal 102 through the power feeding conductor 80, and also the second antenna 181 is coupled to the reception filter 65 at the reception power input terminal 112 through the second power feeding conductor 180. As compared with the embodiment shown in FIG. 1, the present embodiment has the effect of reducing the out of band attenuation amount of the transmission and reception filters.

Figure 6:
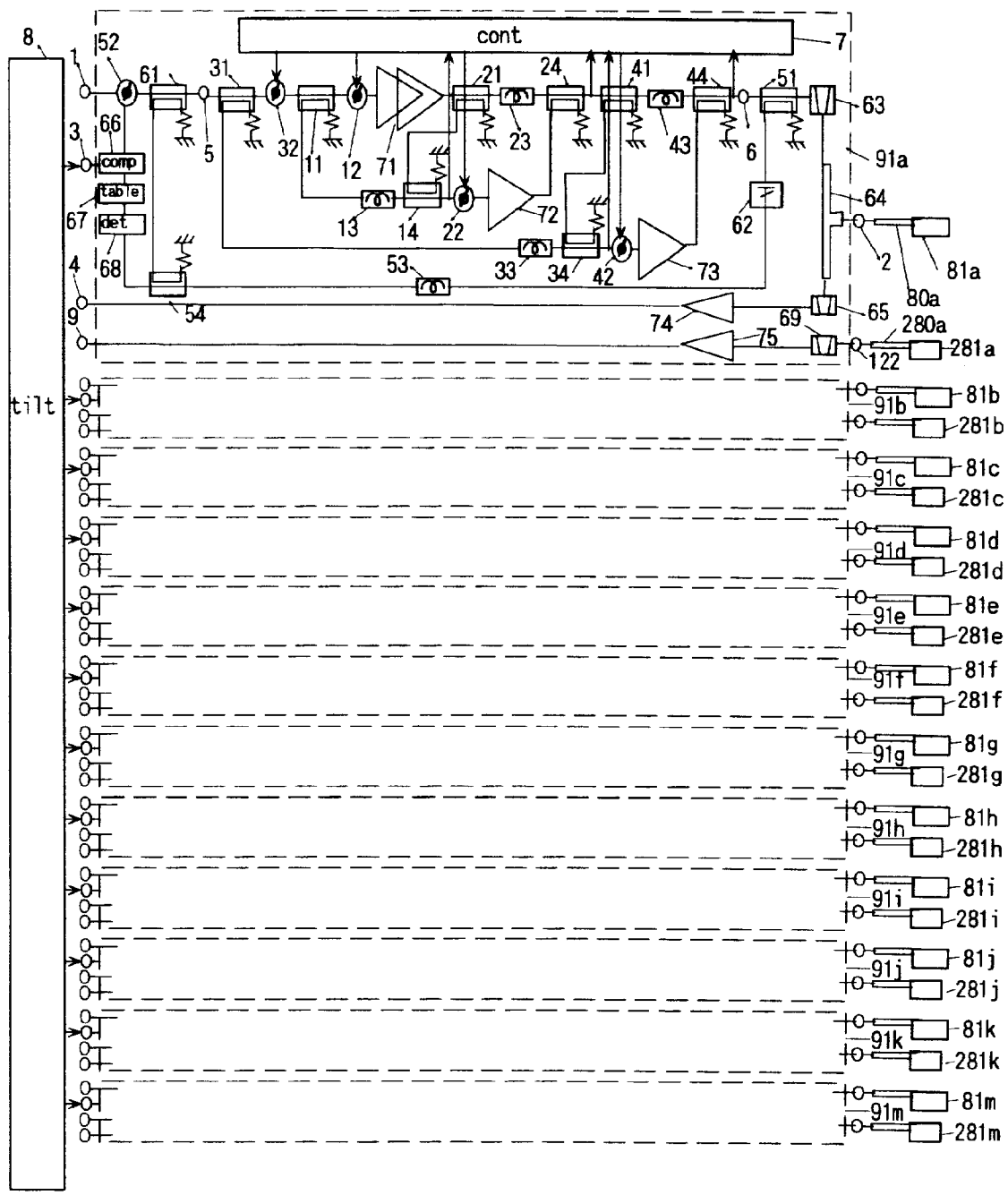
FIG. 6 is a block diagram, partly in circuit diagram, showing a configuration of a further embodiment of a system for transmitting/receiving a signal having a carrier frequency band for a radio base station according to the present invention.

FIG. 6 is a block diagram, partly in circuit diagram, showing a configuration of a further embodiment of a system for transmitting/receiving a signal having a carrier frequency band for a radio base station according to the present invention. A point of difference of the present embodiment from the embodiment shown in FIG. 4 is that for the purpose of making the diversity reception possible, each of the automatic phase shift control feed forward transmission/reception signal amplifying devices 91a to 91k and 91m includes a second reception signal output terminal 9 through which the received signal is inputted to a modulator and demodulator of the associated transmission/reception device, the second reception signal output terminal 9 is coupled to the output terminal of the fifth power amplifier 75, the second reception filter 69 is coupled to the input terminal of the fifth power amplifier 75, and a third antenna 281 the main polarization direction of which inter-sects perpendicularly that of the first antenna 80 is coupled to the second reception filter 69 at the second reception power input terminal 122 through a third power feeding conductor 280. In addition to the effect inherent in the embodiment shown in FIG. 1, the present embodiment has the effect of being able to realize the diversity reception.

Figure 7:
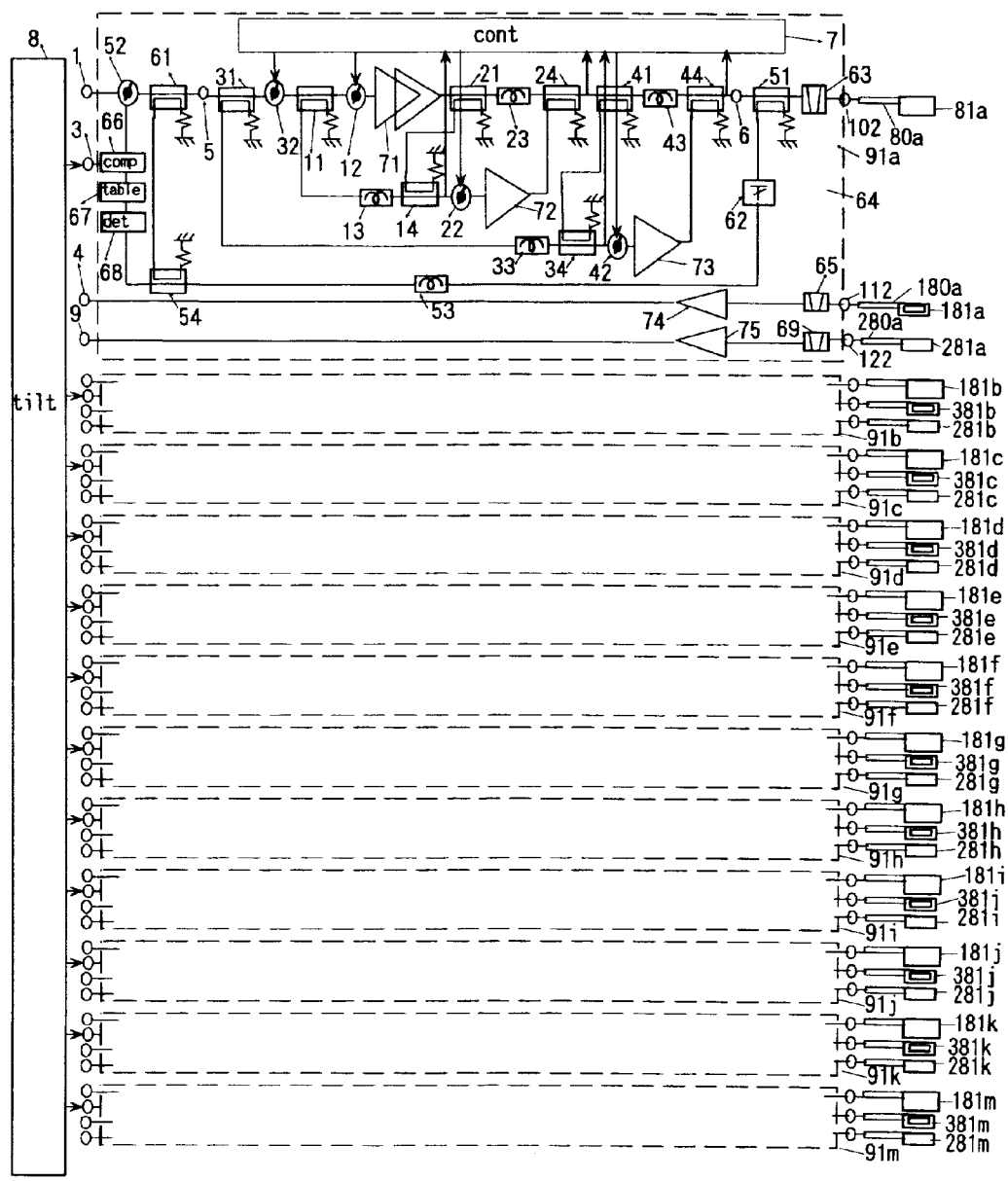
FIG. 7 is a block diagram, partly in circuit diagram, showing a configuration of an even further embodiment of a system for transmitting/receiving a signal having a carrier frequency band for a radio base station according to the present invention.

FIG. 7 is a block diagram, partly in circuit diagram, showing a configuration of an even further embodiment of a system for transmitting/receiving a signal having a carrier frequency band for a radio base station according to the present invention. A point of difference of the present embodiment from the embodiment shown in FIG. 5 is that in order to make the diversity reception possible, each of the automatic phase shift control feed forward transmission/reception signal amplifying devices 91a to 91k and 91m includes a second reception signal output terminal 9, the second reception signal output terminal 9 is coupled the output terminal of the fifth power amplifier 75, the second reception filter 69 is coupled to the input terminal of the fifth power amplifier 75, and a third antenna 281 the main polarization direction of which intersects perpendicularly that of the second antenna 181 is coupled to the second reception filter 69 at the second reception power input terminal 122 through a third power feeding conductor 280. In addition to the effect of the embodiment shown in FIG. 3, the present embodiment has the effect of being able to realize the diversity reception.

Figure 8:
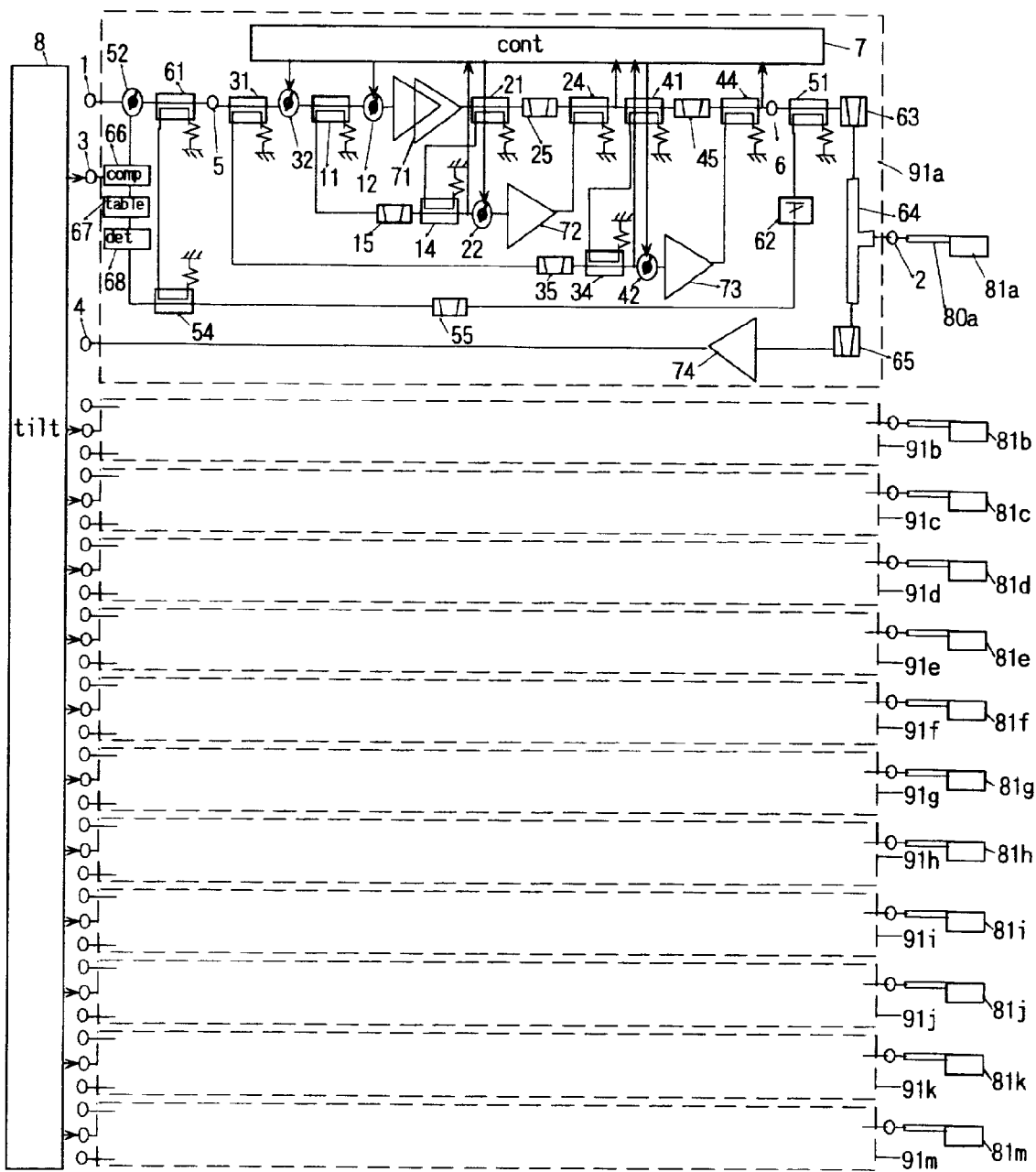
FIG. 8 is a block diagram, partly in circuit diagram, showing a configuration of another embodiment of a system for transmitting/receiving a signal having a carrier frequency band for a radio base station according to the present invention.

FIG. 8 is a block diagram, partly in circuit diagram, showing a configuration of a modification of the embodiment shown in FIG. 4 according to the present invention. A point of difference of the present modification from the embodiment shown in FIG. 4 is that the first delay line 13, the second delay line 23, the third delay line 33, the fourth delay line 43 and the fifth delay line 53 are respectively replaced with a first delay filter 15, a second delay filter 25, a third delay filter 35, a fourth delay filter 45 and a fifth delay filter 55. According to the present modification, the loss of the delay circuit is reduced in substantially the same linear characteristics resulting from the effect of compensating for the distortion of the feed forward.

Figure 9:
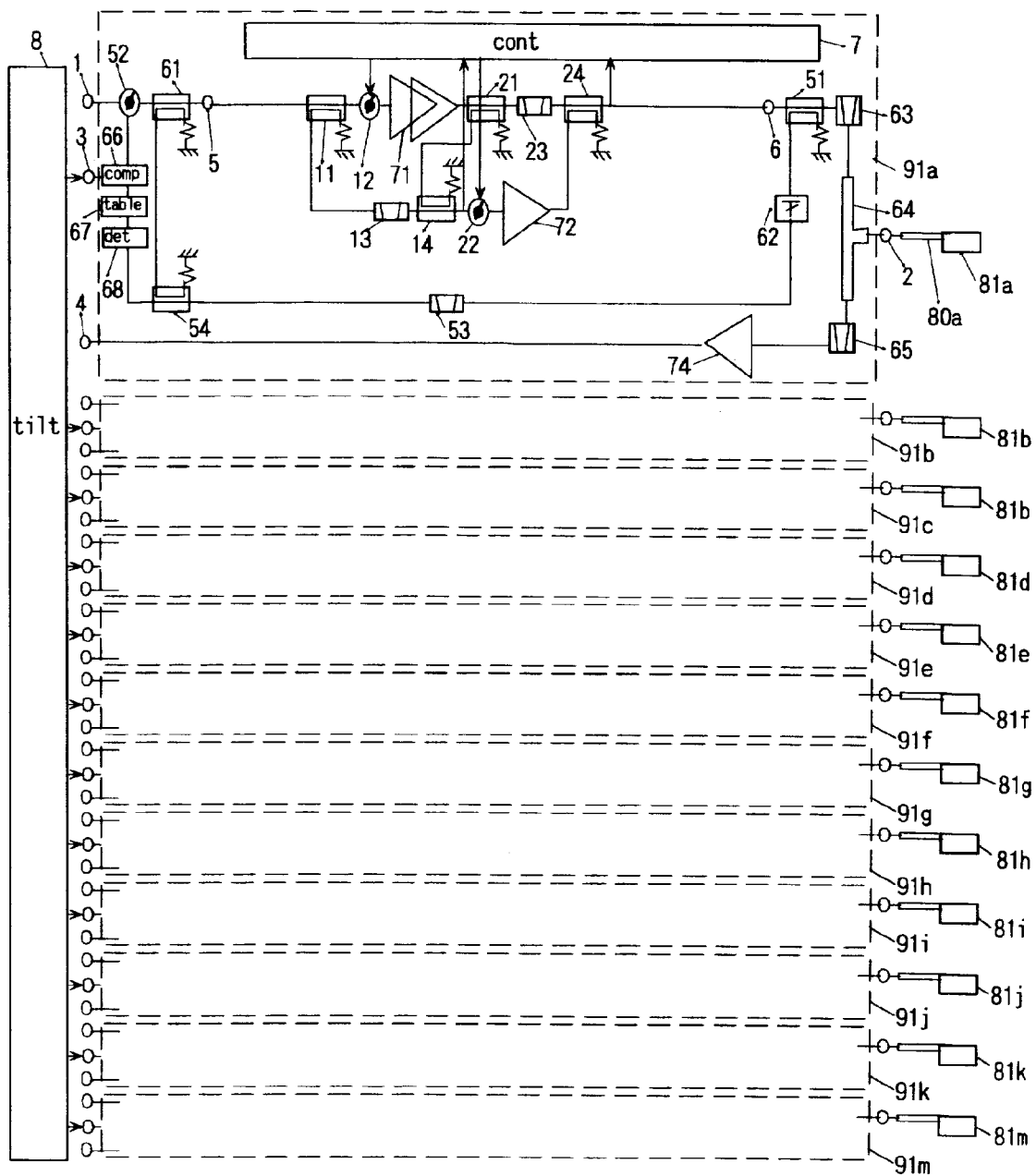
FIG. 9 is a block diagram, partly in circuit diagram, showing a configuration of still another embodiment of a system for transmitting/receiving a signal having a carrier frequency band for a radio base station according to the present invention.

FIG. 9 is a block diagram, partly in circuit diagram, showing a configuration of another modification of the embodiment shown in FIG. 4 according to the present invention. A point of difference of the present modification from the embodiment shown in FIG. 4 is that the feed forward amplifier which is included in each of the automatic phase shift control feed forward transmission/reception signal amplifying circuits 91 has one loop configuration. That is, the second combiner 24 is directly coupled to the transmission filter 63 at the feed forward power amplifier output terminal 6 through the fifth splitter 51, the sixth splitter 61 is directly coupled to the first splitter 11 at the feed forward amplifier input terminal 5, and the third splitter 31, the third variable phase shifter and variable attenuator 32, the third delay line 33, the third combiner 34, the fourth splitter 41, the fourth variable phase shifter and variable attenuator 42, the fourth delay line 43, and the fourth combiner 44 in the circuit of the embodiment shown in FIG. 4 are all removed. In the case where the linear characteristics of the semiconductor device used in the feed forward amplifier are excellent, or in the case where the specification of the transmission signal amplifier made from the system request is not severe, it is possible to miniaturize the system for transmitting/receiving a signal having a carrier frequency band for a mobile radio base station.

Figure 10:
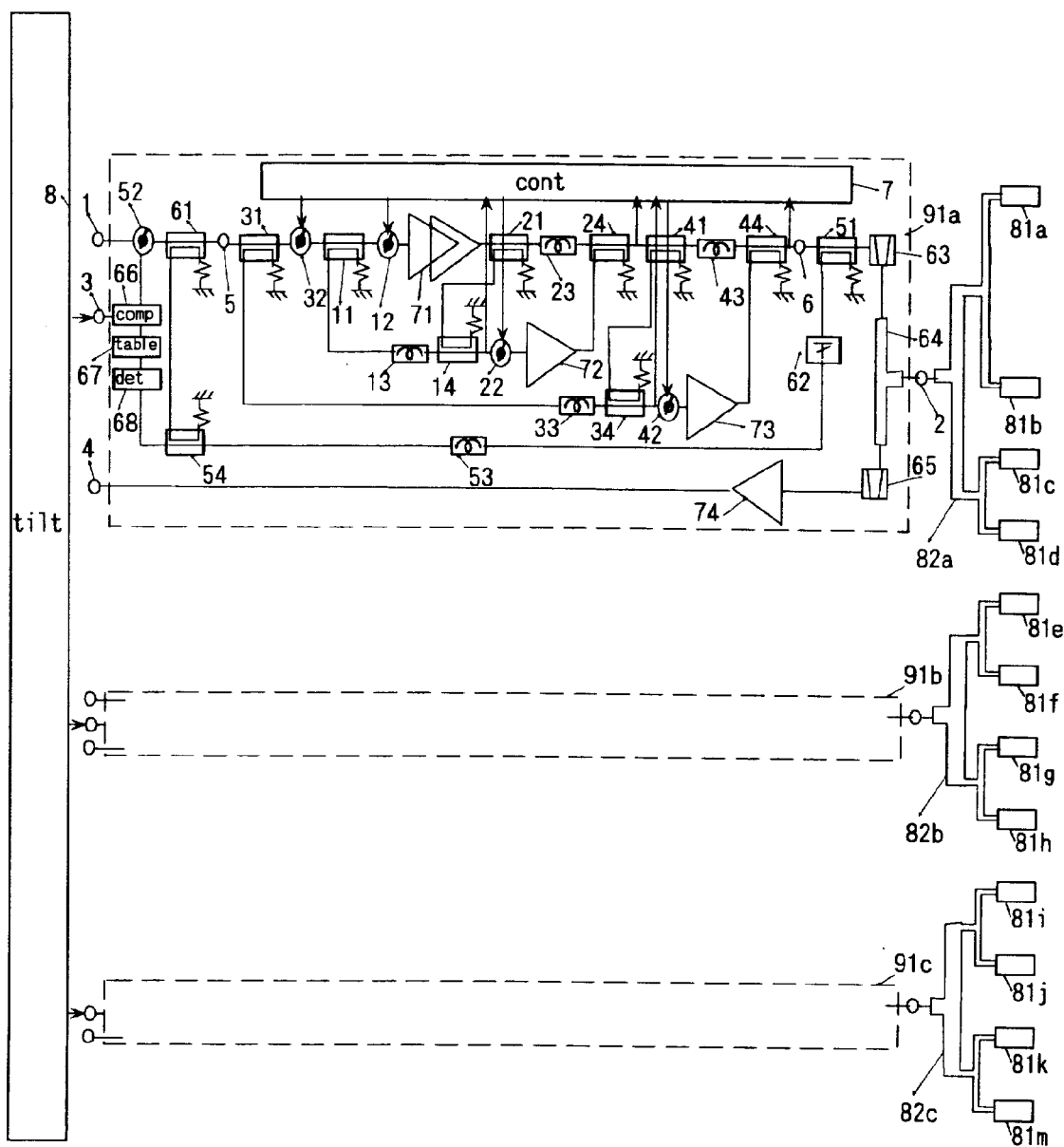
FIG. 10 is a block diagram, partly in circuit diagram, showing a configuration of yet another embodiment of a system for transmitting/receiving a signal having a carrier frequency band for a radio base station according to the present invention.

FIG. 10 is a block diagram, partly in circuit diagram, showing a configuration of still another modification of the embodiment shown in FIG. 4 according to the present invention. A point of difference of the present modification from the embodiment shown in FIG. 4 is that the antenna which is connected to the transmission/reception signal input/output terminal 2 is replaced with the sub-array constituted by the basic antennas forming the array antenna as the constituent element of the prior art system shown in FIG. 2. The sub-array is constituted by a plurality of first antennas 81 as the basic antennas, e.g., the four first antennas in the present modification and a tournament distribution power feeding circuit 82 by which the four first antennas 81 are integrated in a tournament manner. According to the present modification, in the case where the transmission output of the system request is low in level, it is possible to reduce the required number of automatic phase shift control feed forward transmission/reception signal amplifying devices which are used to realize the transmission/reception system according to the present invention.

FIG. 11 is a top plan view and a longitudinal ross sectional view showing the arrangement of a plurality of basic antennas as the constituent elements of the system for transmitting/receiving a signal having a carrier frequency band for a mobile radio base station according to an embodiment of the present invention. As shown in FIG. 11, in the system for transmitting/receiving a signal having a carrier frequency band for a radio base station in each of the embodiments shown in FIGS. 4, 8, 9 and 10, the first antennas 81 which are coupled to the common branches of the branch circuits 64 of the automatic phase shift control feed forward transmission/reception signal amplifying devices 91 as the constituent elements of the system are constructed in the form of the array antenna of microstrip antennas 1080 which are planarly formed on a plate-like dielectric 2000 backed with a plate-like conductor 1000, and to which the earth electric potential is electrically common. In the embodiment shown in FIG. 11, the microstrip antennas 1080 as the individual element antennas forming the array antenna including four elements 1080a to 1080d. The resonance length L of each of the microstrip antennas 1080a to 1080d is approximately half the wavelength of the used frequency. In addition, the microstrip antennas 1080 are respectively coupled to transmission/reception signal sources 1002 which are equivalent to the automatic phase shift control feed forward transmission/reception signal amplifying devices 91 through power feeding lines 1003, and also are coupled to the plate-like conductor 1000 through earth lines 1001, respectively. According to the present embodiment, on the basis of the principles of the array antenna, the electric power which is fed from the microstrip antennas 1080a to 1080d is spatially combined with approximately no loss to be radiated into the air. Also, the electromagnetic waves coming from the air can be similarly combined through the automatic phase shift control feed forward transmission/reception signal amplifying devices 91 at high efficiency.

FIG. 12 is a top plan view and a longitudinal cross sectional view showing the arrangement of a plurality of basic antennas as the constituent elements of the system for transmitting/receiving a signal having a carrier frequency band for a mobile radio base station according to another embodiment of the present invention. A point of difference of the present embodiment from the embodiment shown in FIG. 11 is that the basic antennas constituting the array antenna are printed dipole antennas 1180. The present embodiment is different in construction from the embodiment of FIG. 11 in that the plate-like conductor 1000 is not provided, and in that the printed dipole antennas 1180 are installed instead of the microstrip antennas 1080, the power feeding lines 1003 are respectively connected to first conductors of the printed dipole antennas 1180, and the earth lines 1001 are respectively connected to second conductors of the printed dipole antennas 1180. According to the present embodiment, there is provided the effect that the electromagnetic waves are uniformly radiated within the plane, which is perpendicular to the longitudinal direction of the printed dipole antennas 1180, from the printed dipole antennas 1180.

Figure 13:
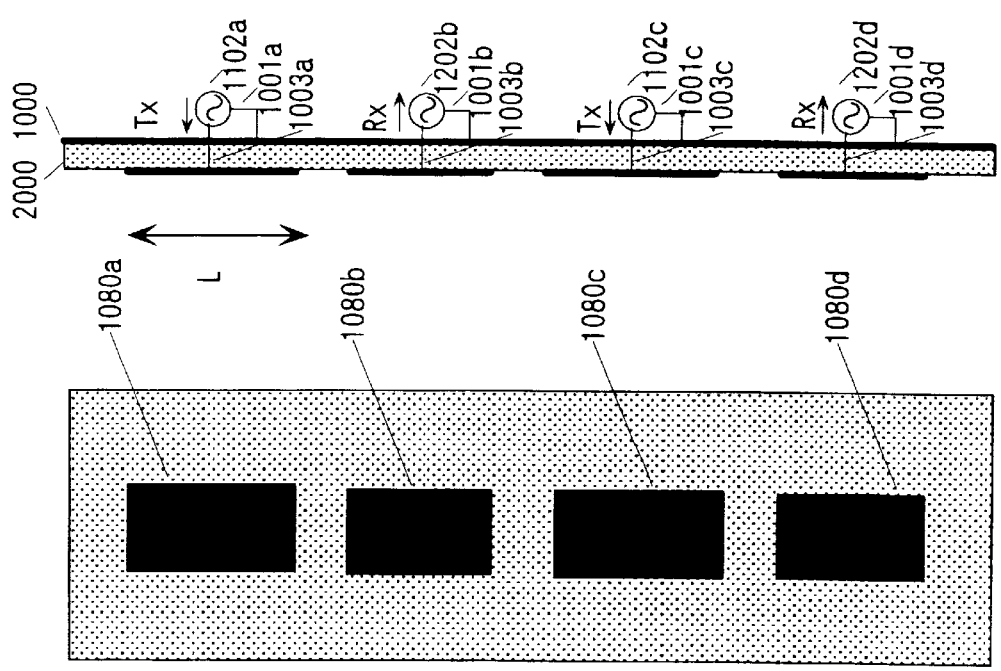
FIG. 13 is a front view and a cross sectional view showing the construction of antennas as constituent elements of still another embodiment of a system for transmitting/receiving a signal having a carrier frequency band for a radio base station according to the present invention.

FIG. 13 is a top plan view and a longitudinal cross sectional view showing the arrangement of a plurality of basic antennas as the constituent elements of the system for transmitting/receiving a signal having a carrier frequency band for a mobile radio base station according to still another embodiment of the present invention. As shown in FIG. 13, in the system for transmitting/receiving a signal having a carrier frequency band for a radio base station of the embodiment shown in FIG. 5, the first antennas 81 which are coupled to the transmission filters 63 of the automatic phase shift control feed forward transmission/reception signal amplifying devices 91 as the constituent elements of the system and the second antennas 181 which are coupled to the reception filters 65 thereof are constructed in the form of the array antenna of the microstrip antennas 1080 which are planarly formed on the plate-like dielectric 2000 backed with a plate-like conductor 1000, and to which the earth electric potential is electrically common. In the embodiment shown in FIG. 13, the microstrip antennas 1080 as the individual element antennas forming the array antenna consist of four elements 1080a to 1080d. The resonance length L of each of the microstrip antennas 1080a to 1080d is approximately half the wavelength of the used frequency. In the microstrip antennas 1080, the microstrip antennas 1080a and 1080c are used as the transmission antennas, while the microstrip antennas 1080b and 1080d are used as the reception antennas. Then, the microstrip antennas 1080a and 1080c, and the microstrip antennas 1080b and 1080d are alternately arranged along the longitudinal direction. Also, the microstrip antennas 1080a and 1080c are coupled to the transmission wave sources 1102 which are equivalent to the transmission electric power output terminals 102 of the automatic phase shift control feed forward transmission/reception signal amplifying devices 91 through power feeding lines 1003, and also coupled to the plate-like conductor 1000 through the earth lines 1001, respectively, while the microstrip antennas 1080b and 1080d are coupled to reception wave sources 1202 which are equivalent to the reception electric power input terminals 112 of the automatic phase shift control feed forward transmission/reception signal amplifying devices 91 through the power feeding lines 1003, and also are coupled to the plate-like conductor 1000 through the earth lines 1001, respectively. According to the present embodiment, in addition to the effect inherent in the embodiment of FIG. 11, there is provided the effect that the out of band attenuator amount of the transmission filter and the reception filter can be reduced.

Figure 14:
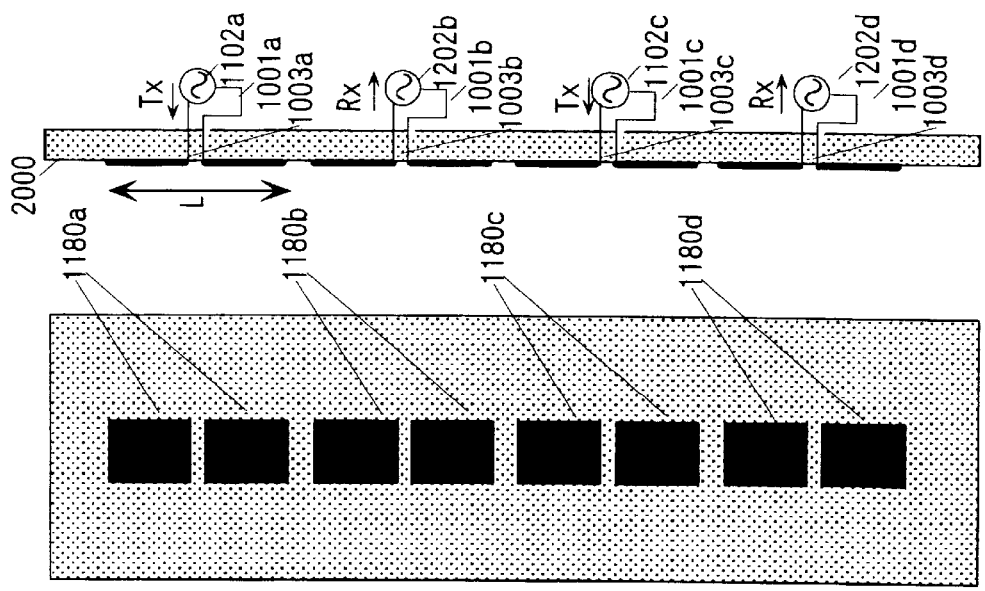
FIG. 14 is a front view and a cross sectional view showing the construction of antennas as constituent elements of yet another embodiment of a system for transmitting/receiving a signal having a carrier frequency band for a radio base station according to the present invention.

FIG. 14 is a top plan view and a longitudinal cross sectional view showing the arrangement of a plurality of basic antennas as the constituent elements of the system for transmitting/receiving a signal having a carrier frequency band for a mobile radio base station according to yet another embodiment of the present invention. A point of difference of the present embodiment from the embodiment shown in FIG. 13 is that the basic antennas constituting the array antenna are printed dipole antennas 1180. The present embodiment is different in construction from the embodiment shown in FIG. 11 in that the plate-like conductor 1000 is not provided, and in that the printed dipole antennas 1180 are installed instead of the microstrip antennas 1080, the power feeding lines 1003 are respectively connected to first conductors of the printed dipole antennas 1180, and the earth lines 1001 are respectively connected to second conductors of the printed dipole antennas 1180. According to the present embodiment, there is provided the effect that the electromagnetic waves can be uniformly radiated within the plane, which is perpendicular to the longitudinal direction of the printed dipole antennas 1180, from the printed dipole antennas 1180.

Figure 15:
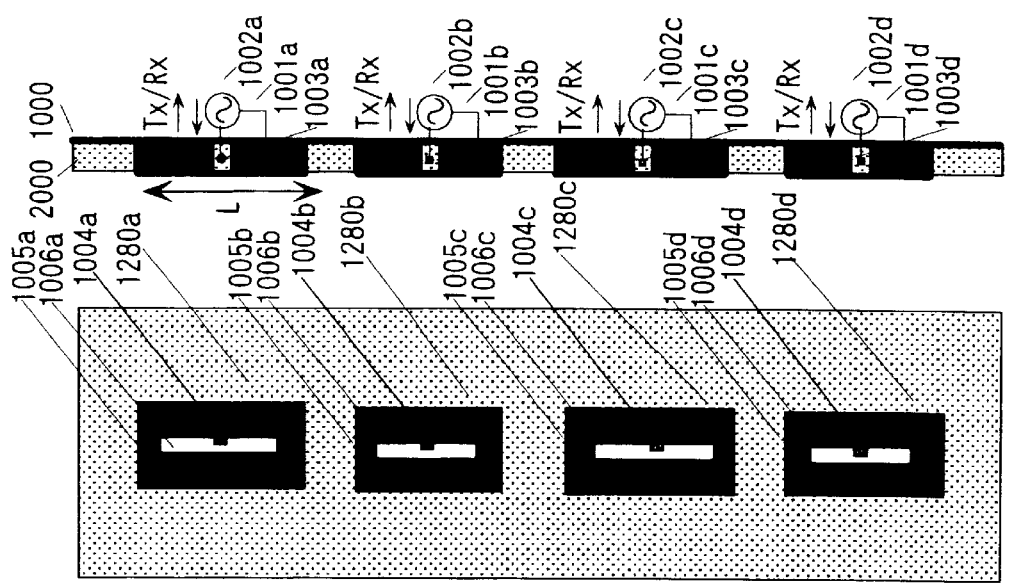
FIG. 15 is a front view and a cross sectional view showing the construction of antennas as constituent elements of a further embodiment of a system for transmitting/receiving a signal having a carrier frequency band for a radio base station according to the present invention.

FIG. 15 is a top plan view and a longitudinal cross sectional view showing the arrangement of a plurality of basic antennas as the constituent elements of the system according to a further embodiment of the present invention. A point of difference of the present embodiment from the embodiment shown in FIG. 11 is that the basic antennas constituting the array antenna are slot antennas 1280. The present embodiment is different in construction from the embodiment shown in FIG. 11 in that slots 1006 are formed in the upper surfaces of flat square conductor boxes 1005, the lower surfaces of the flat square conductor boxes 1005 are in face-contact with the plate-like conductor, and in the inside of the flat square conductor boxes 1005, inner conductors 1004 are installed in such a away that parts thereof intersect perpendicularly the slots 1006 in the positional relation of torsion, and the power feeding lines 1003 are respectively connected to the inner conductors 1004, and also the earth lines 1001 are connected to the plate-like conductor 1000. In such a way, the slot antennas 1280 of the present embodiment shown in FIG. 15 are constructed. According to the present embodiment, there is provided the effect that the transmission and the reception of the electromagnetic wave which has the main polarization in the direction perpendicular to the longitudinal direction of the array can be made possible.

Figure 16:
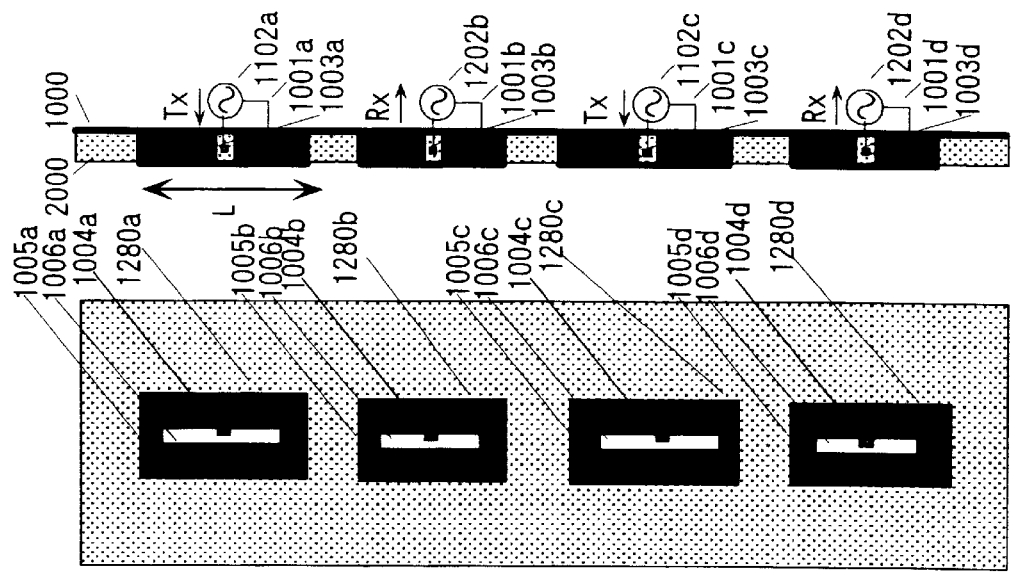
FIG. 16 is a front view and a cross sectional view showing the construction of antennas as constituent elements of an even further embodiment of a system for transmitting/receiving a signal having a carrier frequency band for a radio base station according to the present invention.

FIG. 16 is a top plan view and a longitudinal cross sectional view showing the arrangement of a plurality of basic antennas as the constituent elements of the system according to an even further embodiment of the present invention. A point of difference of the present embodiment from the embodiment shown in FIG. 13 is that the basic antennas constituting the array antenna are the slot antennas 1280. The construction of the basic antennas of the present embodiment is the same as that of the basic antennas of the embodiment shown in FIG. 15. According to the present embodiment, the effect of the embodiment shown in FIG. 13 can be realized for the electromagnetic wave which has the main polarization in the direction perpendicular to the longitudinal direction of the array.

Figure 17:
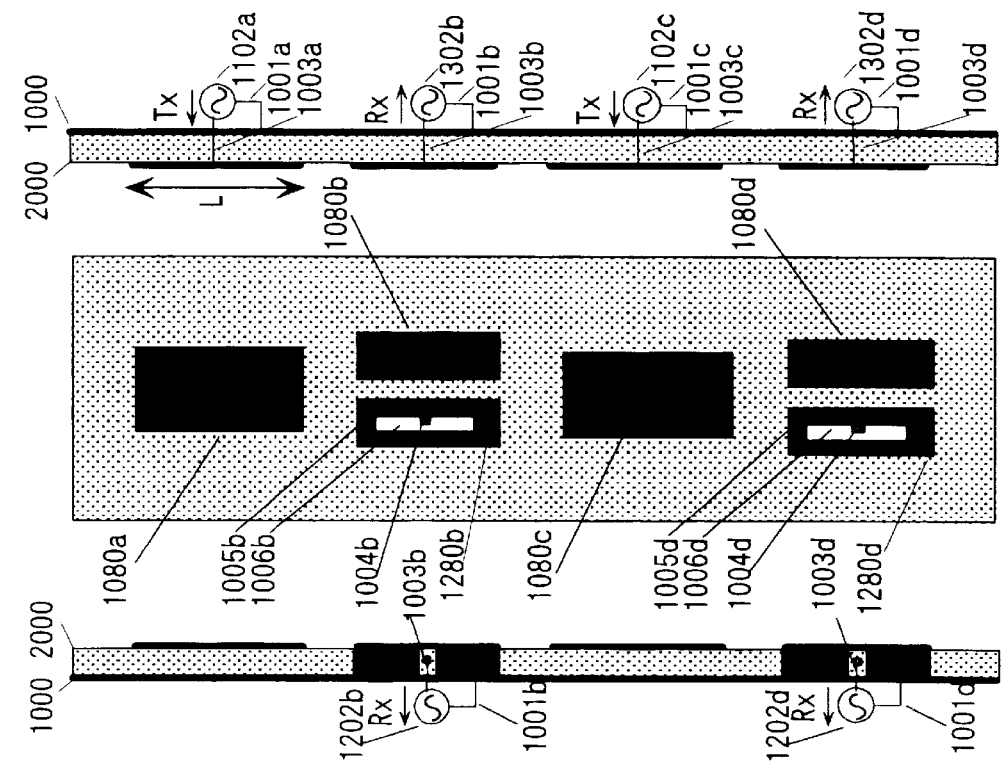
FIG. 17 is a front view and a cross sectional view showing the construction of antennas as constituent elements of another embodiment of a system for transmitting/receiving a signal having a carrier frequency band for a radio base station according to the present invention.

FIG. 17 is a top plan view and a longitudinal cross sectional view showing the arrangement of a plurality of basic antennas as the constituent elements of the system according to another embodiment of the present invention. As shown in FIG. 17, in the system for transmitting/receiving a signal having a carrier frequency band for a radio base station of the embodiment shown in FIG. 6, the first antennas 81 which are coupled to the common branches of the branch circuits 64 of the automatic phase shift feed forward transmission/reception signal amplifying devices 91 as the constituent elements of the system are constructed in the form of an array antenna of the microstrip antennas 1080 which are planarly formed in the plate-like dielectric 2000 backed with the plate-like conductor 1000, and to which the earth electric potential is electrically common. In the present embodiment shown in FIG. 17, the microstrip antennas 1080 as the first element antennas constituting the array antenna are two elements 1080*a* and 1080*c*, the resonance length L of each of the microstrip antennas 1080*a* and 1080*c* is approximately half the wavelength of the used frequency; the microstrip antennas 1080 are coupled to the transmission/reception wave sources 1002 which are equivalent to the automatic phase shift control feed forward transmission/reception signal amplifying devices 91 through the power feeding lines 1003 and also are coupled to the plate-like conductor 1000 through the earth lines 1001; the third antennas 281 which are coupled to the second reception filters 69 of the automatic phase shift control feed forward transmission/reception signal amplifying devices 91 at the second reception electric power input terminals 122 are constructed in the form of the slot antennas 1280*b* and 1280*d*; for the microstrip antennas 1080, the two elements 1080*a* and 1080*c* are used as the antennas each of which is used both as the transmission antenna and the reception antenna; the slot antennas 1280*b* and 1280*d* are used as the reception dedicated antennas and the microstrip antennas 1080*a* and 1080*c*, and the slot antennas 1280*b* and 1280*d* are arranged alternately along the longitudinal direction of the array; the microstrip antennas 1080*a* and 1080*c* are coupled to the transmission/reception wave sources 1002 which are equivalent to the transmission/reception electric power input/output terminals 2 of the automatic phase shift control feed forward transmission/reception signal amplifying devices 91 through the power feeding lines 1003 and also are coupled to the plate-like conductor 1000 through the earth lines 1001; and the slot antennas 1280*b* and 1280*d* are coupled to the reception wave sources 1202 which are equivalent to the reception electric power input terminals 122 of the automatic phase shift control feed forward transmission/reception signal amplifying devices 91 through the power feeding lines 1003 and also are coupled to the plate-like conductor 1000 through the earth lines 1001. According to the present embodiment, since the main polarization direction of the microstrip antennas 1080*a* and 1080*c* intersects perpendicularly that of the slot antennas 1280*b* and 1280*d*, the present system has the polarization diversity reception function.

Figure 18:
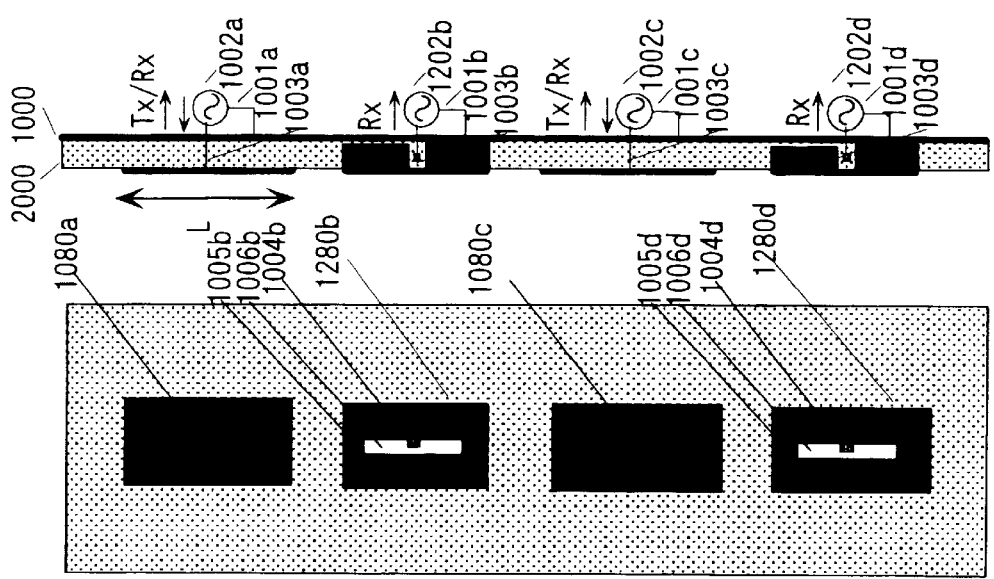
FIG. 18 is a front view and a cross sectional view showing the construction of antennas as constituent elements of still another embodiment of a system for transmitting/receiving a signal having a carrier frequency band for a radio base station according to the present invention.

FIG. 18 is a top plan view and a longitudinal cross sectional view showing the arrangement of a plurality of basic antennas as the constituent elements of the system according to still another embodiment of the present invention. As shown in FIG. 18, in the system of the embodiment shown in FIG. 7, the first antennas 81 which are coupled to the transmission filters 63 of the automatic phase shift control feed forward transmission/reception signal amplifying devices 91 as the constituent elements of the system and the second antennas 181 which are coupled to the reception filters 65 are constructed in the form of the array antenna of the microstrip antennas 1080 which are planarly formed on the plate-like dielectric 2000 backed with the plate-like conductor 1000, and to which the earth electric potential is electrically common; the third antennas 281 which are coupled to the second reception filters 69 of the automatic phase shift control feed forward transmission/reception signal amplifying devices 91 are constructed in the form of the slot antennas 1280*b* and 1280*d* which are planarly formed on the plate-like dielectric 2000 backed with the conductor plate 1000 and to which the earth electric potential is electrically common; the microstrip antennas 1080 as the element antennas constituting the array antenna are, in the embodiment of FIG. 18, the four elements 1080*a* to 1080*d*; the resonance length L of each of the microstrip antennas 1080*a* to 1080*d* is approximately half the wavelength of the used frequency; for the microstrip antennas 1080, the elements 1080a and 1080c are used as the transmission antennas, while the elements 1080b and 1080d are used as the first reception antennas; the slot antennas 1280 as another element antennas are the two elements 1280b and 1280d which are used as the second reception antennas; the microstrip antennas 1080b and 1080d as the first reception antennas arranged along the longitudinal direction of the array, and the slot antennas 12280b and 1280d as the second reception antennas are arranged in parallel with the positional relation in which the longitudinal direction as the direction of the resonance length of the microstrip antennas, and the direction along the slots of the slot center portions of the slot antennas extend in parallel with each other; the microstrip antennas 1080a and 1080c as the transmission antennas, and the antenna groups which the first and second reception antennas form which are arranged in parallel with each other are alternately arranged; the microstrip antennas 1080a and 1080c are coupled to the transmission wave sources 1102 which are equivalent to the transmission electric power output terminals 102 of the automatic phase shift control feed forward transmission/reception signal amplifying devices 91 through the power feeding lines 1003 and also are coupled to the plate-like conductor 1000 through the earth lines 1001; the microstrip antennas 1080b and 1080d are coupled to the second reception wave sources 1302 which are equivalent to the first reception electric power output terminals 112 of the automatic phase shift control feed forward transmission/reception signal amplifying devices 91 through the power feeding lines 1003 and also are coupled to the plate-like conductor 1000 through the earth lines 1001; and the slot antennas 1280b and 1280d are coupled to the reception wave sources 1202 which are equivalent to the second reception electric power input terminals 122 of the automatic phase shift control feed forward transmission/reception signal amplifying devices 91 through the power feeding lines 1003 and the inner conductors 1004 and also are coupled to the plate-like conductor 1000 through the earth lines 1001. According to the present embodiment, since the direction of the main polarization of the microstrip antennas 1080a and 1080c intersects perpendicularly that of the slot antennas 1280b and 1280d, in addition to the effect of the embodiment shown in FIG. 13, the present system has also the effect of being able to realize the polarization diversity reception function.

Figure 19:
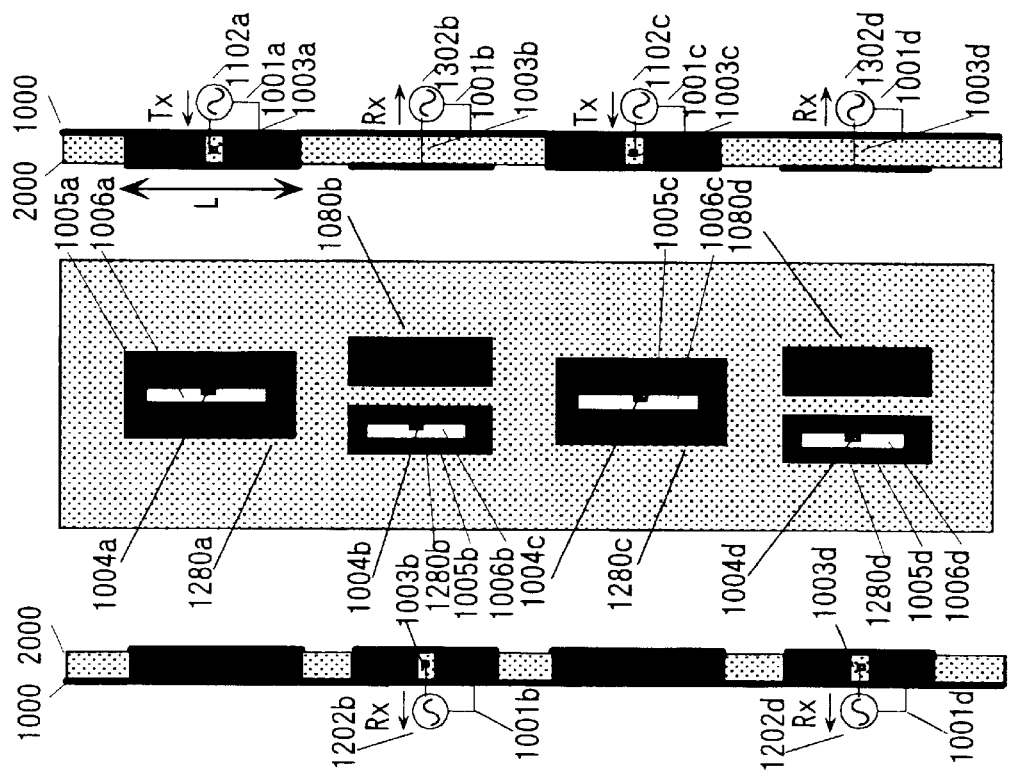
FIG. 19 is a front view and a cross sectional view showing the construction of antennas as constituent elements of yet another embodiment of a system for transmitting/receiving a signal having a carrier frequency band for a radio base station according to the present invention.

FIG. 19 is a top plan view and a longitudinal cross sectional view showing the arrangement of a plurality of basic antennas as the constituent elements of the system according to yet another embodiment of the present invention. As shown in FIG. 19, in the system of the embodiment shown in FIG. 6, the first antennas 81 which are coupled to the common branches of the branch circuits 64 of the automatic phase shift control feed forward transmission/ reception signal amplifying devices 91 as the constituent elements of the system are constructed in the form of the array antenna of the slot antennas 1280 which are planarly formed on the plate-like dielectric 2000 backed with the conductor plate 1000 as described in the embodiment of FIG. 15 and to which the earth electric potential is electrically common; the slot antennas 1280 as the first element antennas constituting the array antenna are, in the embodiment of FIG. 19, the two elements 1280a and 1280c; the slot antennas 1280 are coupled to the transmission/reception wave sources 1002 which are equivalent to the automatic phase shift control feed forward transmission/reception signal amplifying devices 91 through the power feeding lines 1003 and the inner conductors 1004 and also are coupled to the plate-like conductor 1000 through the earth lines 1001; the third antennas 281 which are coupled to the second reception filters 69 of the automatic phase shift control feed forward transmission/reception signal amplifying devices 91 at the second reception electric power input terminals 122 are the microstrip antennas 1080b and 1080d; the resonance length L of each of the microstrip antennas 1080b and 1080d is approximately half the wavelength of the used frequency; and the microstrip antennas 1080 are coupled to the reception wave sources 1202 which are equivalent to the reception electric power input terminal 122 of the automatic phase shift control feed forward transmission/reception signal amplifying devices 91 through the power feeding lines 1003 and also are coupled to the plate-like conductor 1000 through the earth lines 1001. According to the present embodiment, since the direction of the main polarization of the microstrip antennas 1080a and 1080c intersects perpendicularly that of the slot antennas 1280b and 1280d, the present system has both of the function of radiating the transmission wave having the main polarization direction intersecting perpendicularly the longitudinal direction of the antennas, and also the polarization diversity reception function.

Figure 20:
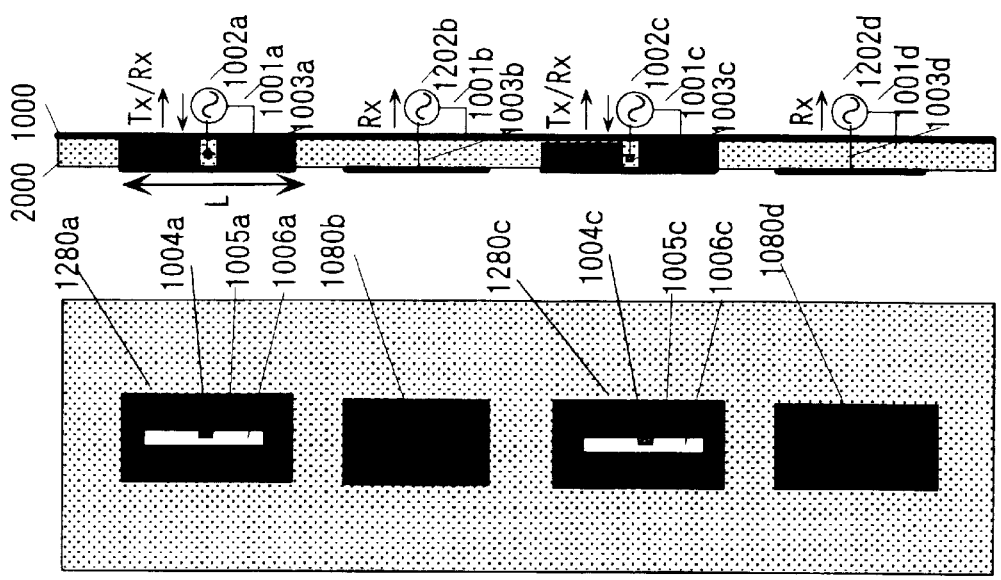
FIG. 20 is a front view and a cross sectional view showing the construction of antennas as constituent elements of a further embodiment of a system for transmitting/receiving a signal having a carrier frequency band for a radio base station according to the present invention.
Figure 21:
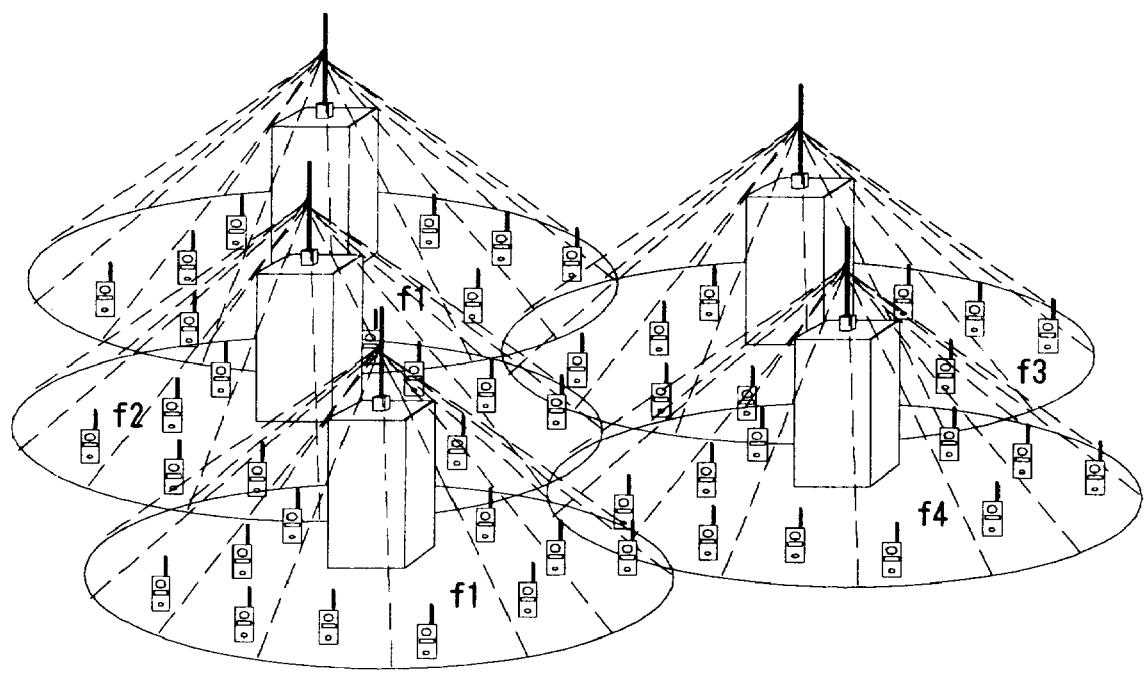
FIG. 21 is a schematic view showing the operation form of a cellular system employing a system for transmitting/receiving a signal having a carrier frequency band for a radio base station according to the present invention.
Figure 22:
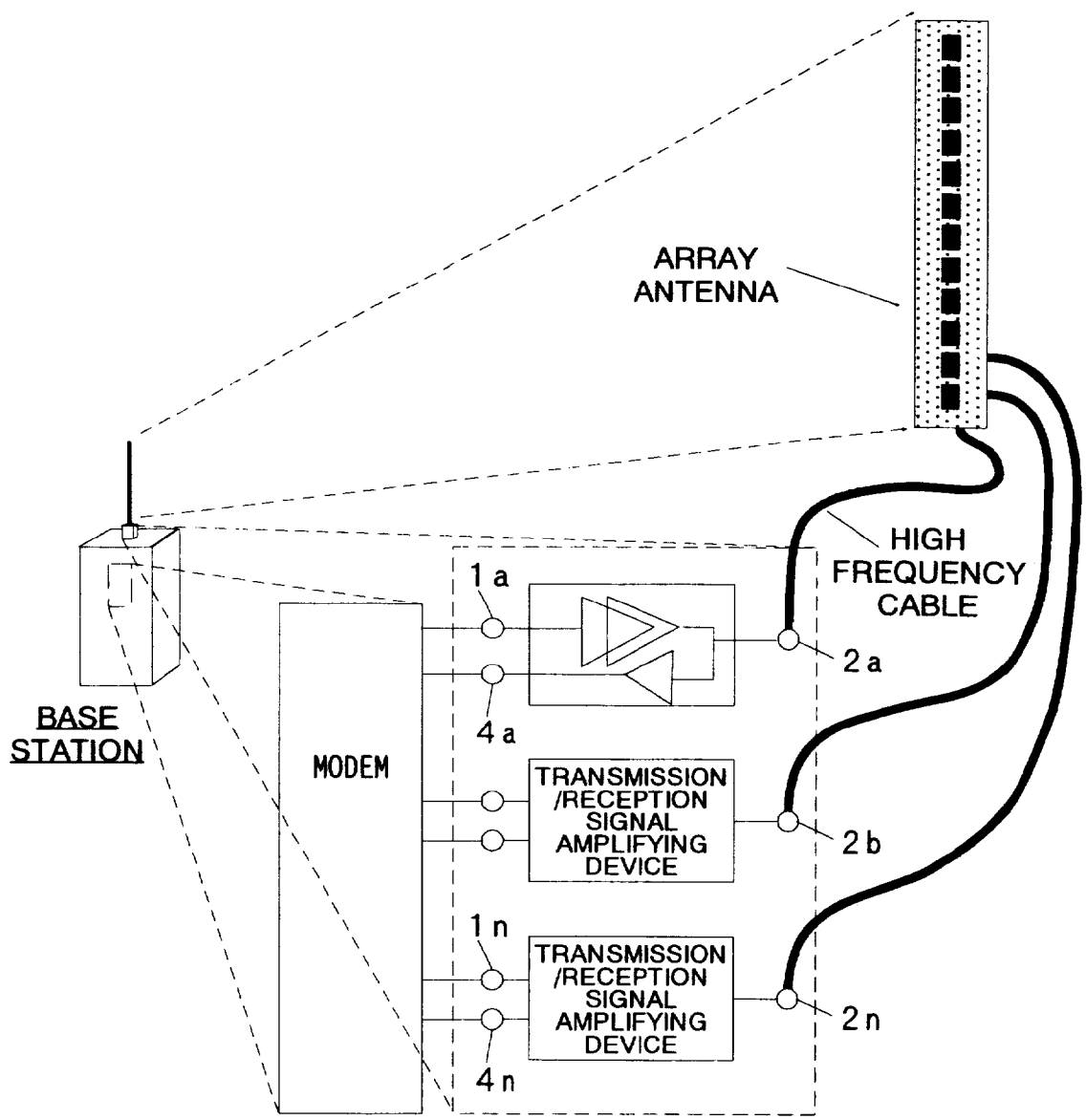
FIG. 22 is a block diagram showing the construction of a cellular base station employing a system for transmitting/receiving a signal having a carrier frequency band for a radio base station according to the present invention.

FIG. 20 is a top plan view and a longitudinal cross sectional view showing the arrangement of a plurality of basic antennas as the constituent elements of the system according to a further embodiment of the present invention. As shown in FIG. 20, in the system of the embodiment shown in FIG. 7, the first antennas 81 which are coupled to the transmission filters 63 of the automatic phase shift control feed forward transmission/reception signal amplifying devices 91 as the constituent elements of the system, and the second antennas 181 which are coupled to the reception filters 65 are constructed in the form of the array antenna of the slot antennas 1280 which are planarly formed on the plate-like dielectric 2000 backed with the conductor plate 1000 as described in the embodiment shown in FIG. 16 and to which the earth electric potential is electrically common; the third antennas 281 which are coupled to the second reception filters 69 of the automatic phase shift control feed forward transmission/reception signal amplifying devices 91 at the second reception electric power input terminals 122 are the microstrip antennas 1080b and 1080d; the slot antennas 1280 as the element antennas constituting the array antenna are, in the embodiment of FIG. 20, the four elements 1280a to 1280d; for the slot antennas 1280, the elements 1280a and 1280c are used as the transmission antennas, while the elements 1280b and 1280d are used as the first reception antennas; the microstrip antennas 1080 as the other element antennas are the two elements 1080b and 1080d; the resonance length L of the microstrip antennas 1080a and 1080d is approximately half the wavelength of the used frequency; the microstrip antennas 1080b and 1080d are used as the second reception antennas; the microstrip antennas 1080b and 1080d as the second reception antennas arranged along the longitudinal direction of the array, and the slot antennas 1280b and 1280d as the first reception antennas are arranged in parallel with the positional relation in which the longitudinal direction as the direction of the resonance length L of each of the microstrip antennas, and the direction along the slots of the slot center points of the slot antennas extend in parallel with each other; the slot antennas 1280a and 1280c as the transmission antennas and the antenna groups which the first and second reception antennas form which are arranged in parallel with each other are alternately arranged; the slot antennas 1280a and 1280c are coupled to the transmission wave sources 1102 which are equivalent to the transmission electric power output terminals 102 of the automatic phase shift control feed forward transmission/reception signal amplifying devices 91 through the power feeding lines 1003 and the inner conductors 1004 and also are coupled to the plate-like conductor 1000 through the earth lines 1001; the slot antennas 1280b and 1280d are coupled to the reception wave sources 1202 which are equivalent to the reception electric power input terminals 112 of the automatic phase shift control feed forward transmission/reception signal amplifying devices 91 through the power feeding lines 1003 and the inner conductor 1004 and also are coupled to the plate-like conductor 1000 through the earth lines 1001; the microstrip antennas 1080b and 1080d are coupled to the reception wave sources 1302 which are equivalent to the second reception electric power input terminals 122 of the automatic phase shift control feed forward transmission/reception signal amplifying devices 91 through the power feeding lines 1003 and also are coupled to the plate-like conductor 1000 through the earth lines 1001. According to the present embodiment, since the direction of the main polarization of the microstrip antennas 1080b and 1080d intersects perpendicularly that of the slot antennas 1280b and 1280d, in addition to the effect of the embodiment of FIG. 14, the present system has the effect of being able to realize the polarization diversity reception function.

As set forth hereinabove, according to the present invention, in a system for transmitting/receiving a signal having a carrier frequency band for a base station for a digital radio communication system wherein feed forward amplifiers each having a small output are employed in order to fulfill the specification which is requested by a digital radio communication system since the linearlity of a power amplifying circuit employing a semiconductor device which has essentially the non-linearlity is degraded when outputting the large output; the electric power of the feed forward amplifiers is combined; the gain which is requested by the digital radio communication system is realized by a array antenna; and variable phase shifters are inserted into inputs of the elements or the element group of the array antenna in order to enhance the efficiency of utilizing a frequency of the digital radio communication system in time series, it is possible to reduce the combining loss which was unavoidable for ensuring the isolation between a plurality of input terminals of combiners such as couplers and between the input terminals and the output terminals; it is possible to remove the large loss of the large electric power resulting from that the large electric power appearing at the output of the feed forward amplifier passes through the variable phase shifter which is installed in the before stage of the array antenna; and it is possible to reduce the large loss of the large electric power due to the coupling line through which the unit element antennas constituting the array antennas are coupled to one another. Therefore, it is possible to enhance remarkably the power efficiency of the overall system for transmitting/receiving a signal having a carrier frequency band for a radio base station; it is possible to miniaturize a radiator having great weight with both of the weight and the size of a large power amplifier; and it is possible to realize the miniaturization and the lightweight of a system. In addition, since it is possible to miniaturize greatly a power source for supplying the electric power to the system for transmitting/receiving a signal having a carrier frequency band for a radio base station, it is possible to further miniaturize and lighten the system for transmitting/receiving a signal having a carrier frequency band for a radio base station. If it is realized to greatly miniaturize and lighten the system for transmitting/receiving a signal having a carrier frequency band for a radio base station, then it is possible to completely reduce the very large loss of 6 to 10 dB of a high frequency cable which is indispensable to the construction in which as in the prior art, a transmission power amplifier can not be installed right near an antenna due to the weight overload and the transmission power amplifier is forced to be installed separately from the antenna, and hence through which the antenna and the transmission power amplifier are coupled to each other. As a result, the output electric power required for a main amplifier which constitutes the system for transmitting/receiving a signal having a carrier frequency band for a radio base station and which is configured by utilizing semiconductor devices is remarkably reduced, and also the miniaturization and the lightweight of the system for transmitting/receiving a signal having a carrier frequency band for a radio base station itself are further greatly facilitated.

While the present invention has been particularly shown and described with reference to the preferred embodiments and the specified modifications thereof, it will be understood that the various changes and other modifications will occur to those skilled in the art without departing from the scope and true spirit of the invention. The scope of the invention is therefore to be determined solely by the appended claims.

What is claimed is:

1. A system for transmitting/receiving an electrical signal, said system comprising: a plurality of transmission/reception signal amplifying devices each having a power amplifier, a variable phase shift circuit connected to an input portion of said power amplifier, a power detector connected to an output portion of said power amplifier, and a phase shifting amount table which is constructed on the basis of the characteristics of said power amplifier; a plurality of antennas which are respectively connected to said transmission/reception signal amplifying devices; and a tilt angle control circuit which is connected to said transmission/reception signal amplifying devices, wherein each of the outputs of said power detectors is compared with a control signal of said tilt angle control circuit to adjust the phase shifting amount of said variable phase shifting circuits on the basis of the contents of said phase shifting amount table.

2. A transmission/reception system according to claim 1, wherein said power amplifier is a feed forward power amplifier.

3. A transmission/reception system according to claim 1, wherein said antennas are microstrip antennas.

4. A transmission/reception system according to claim 1, wherein said antennas are slot antennas.

5. A system for transmitting/receiving an electrical signal, wherein a plurality of units each having an antenna and a transmission/reception signal amplifying device connected to said antenna are provided, and each of said plurality of units has a variable phase shift circuit connected to an input terminal for transmission of a transmission electric power amplifier, said circuit serving to take charge of the transmission electric power which is obtained by dividing the total electric power which is to be radiated from all of said antennas into the air.

6. A system for transmitting/receiving a signal having a carrier frequency band for a radio base station, said system comprising:

a plurality of automatic phase shift control feed forward transmission/reception units installed in parallel with one another, each unit comprising:

a first amplifier, a first variable phase shifter and variable attenuator, a first splitter, a first delay line, a first combiner; a second amplifier, a second splitter, a second variable phase shifter and variable attenuator, a second splitter, a second delay line, a second combiner; a third amplifier, a third splitter, a third variable phase shifter and variable attenuator, a third delay line, a third combiner; a fourth splitter, a fourth variable phase shifter and variable attenuator, a fourth delay line, a fourth combiner; a fifth splitter, an attenuator, a fifth delay line, a sixth splitter, a fifth combiner, a signal detector, a table reference circuit, a comparison circuit, a variable phase shifter, a signal control circuit, a transmission filter, a reception filter, a branch circuit, a fourth amplifier, and a first antenna, wherein an input signal terminal of said variable phase shifter is coupled to a transmission signal input terminal; subsequently, said sixth splitter is coupled thereto; an input terminal of said third splitter is coupled to a first output terminal of said sixth splitter; an input terminal of said first splitter is coupled to a first output terminal of said third splitter through said third variable phase shifter and variable attenuator; an input terminal of said first amplifier is coupled to a first output terminal of said first splitter through said first variable phase shifter and variable attenuator; an input terminal of said second splitter is coupled to an output terminal of said first amplifier; a first input terminal of said second combiner is coupled to a first output terminal of said second splitter through said second delay line; an output terminal of said second combiner is coupled to a first input terminal of said fourth splitter; an output terminal of said fourth splitter is coupled to a first input terminal of said fourth combiner through said fourth delay line; an output terminal of said fourth combiner is coupled to an input terminal of said fifth splitter; a first output terminal of said fifth splitter is coupled to one branch of said branch circuit through said transmission filter; said first antenna is coupled to a common branch of said branch circuit; an input terminal of said fourth amplifier is coupled to the other branch of said branch circuit through said reception filter; a reception signal output terminal is coupled to an output terminal of said fourth amplifier; said fifth delay line is coupled to a second output terminal of said fifth splitter through said attenuator; subsequently, a first input terminal of said fifth combiner is coupled thereto; a second output terminal of said sixth splitter is coupled to a second input terminal of said fifth combiner; an output terminal of said fifth combiner is coupled to an input terminal of said table reference circuit through said signal detection circuit; an output terminal of said table reference circuit is coupled to a first input terminal of said comparison circuit; a second input terminal of said comparison circuit is a control signal input terminal of a tilt angle control circuit; an output terminal of said third amplifier is coupled to a second input terminal of said fourth combiner; an output terminal of said third combiner is coupled to an input terminal of said third amplifier through said fourth variable phase shifter and variable attenuator; a second output terminal of said fourth splitter is coupled to a second input terminal of said third combiner; a second output terminal of said third splitter is coupled to a first input terminal of said third combiner through said third delay line; an output terminal of said second amplifier is coupled to a second input terminal of said second combiner; an output terminal of said first combiner is coupled to an input terminal of said second amplifier through said second variable phase shifter and variable attenuator; a second output terminal of said second splitter is coupled to a second input terminal of said first combiner; and a second output terminal of said first splitter is coupled to a first input terminal of said first combiner through said first delay line, and a control circuit for referring to an output signal of said second combiner, an output signal of said fourth combiner, an output signal of said first combiner, and an output signal of said third combiner to control the phase/attenuation amount of said second variable phase shifter and variable attenuator, said fourth variable phase shifter and variable attenuator, said first variable phase shifter and variable attenuator and said third variable phase shifter and variable attenuator, and said one tilt angle control circuit for supplying a control signal to each of the control signal input terminals of said tilt angle control circuit of said plurality of automatic phase shift control feed forward transmission/reception units.

7. A system for transmitting/receiving a signal having a carrier frequency band for a radio base station, said system comprising:

a plurality of automatic phase shift control transmission/reception signal amplifying units installed in parallel with one another, each unit comprising a linear power amplifier, a fifth splitter, an attenuator, a fifth delay line, a sixth splitter, a fifth combiner, a signal detector, a table reference circuit, a comparison circuit, a variable phase shifter, a signal control circuit, a transmission filter, a reception filter, a branch circuit, a fourth amplifier and a first antenna, wherein an input signal terminal of said variable phase shifter is coupled to a transmission signal input terminal; subsequently, said sixth splitter is coupled thereto; an input terminal of said linear power amplifier is coupled to a first output terminal of said sixth splitter; an output terminal of said linear power amplifier is coupled to an input terminal of said fifth splitter; a first output terminal of said fifth splitter is coupled to one branch of said branch circuit through said transmission filter; said first antenna is coupled to a common branch of said branch circuit; an input terminal of said fourth amplifier is coupled to the other branch of said branch circuit; a reception signal output terminal is coupled to an output terminal of said fourth amplifier; said fifth delay line is coupled to a second output terminal of said fifth splitter through said attenuator; subsequently, a first input terminal of said fifth combiner is coupled thereto; a second input terminal of said fifth signal combiner is coupled to a second output terminal of said sixth splitter; an output terminal of said fifth combiner is coupled to an input terminal of said table reference circuit through said signal detection circuit; an output terminal of said table reference circuit is coupled to a first input terminal of said comparison circuit; and a second input terminal of said comparison circuit is a control signal input terminal of one tile angle control circuit, and said one tilt angle control circuit for supplying a control signal to each of the control signal input terminals of said tilt angle control circuit of said plurality of automatic phase shift transmission/reception signal amplifying units.

8. A system according to claim 7, wherein said linear power amplifier is a feed forward type amplifier.

9. A system according to claim 8, wherein said automatic phase shift control feed forward transmission/reception unit includes a second antenna, a fifth amplifier and a second reception filter; said unit includes a second reception signal output terminal; an output terminal of said fifth amplifier is coupled to the second reception signal output terminal; and said second antenna is coupled to an input terminal of said fifth amplifier through said reception filter, thereby making the diversity reception possible.

10. A system according to claim 9, wherein an array constituted by the antenna which is coupled to the common branch of said branch circuit of said automatic phase shift control feed forward transmission/reception unit and the second antenna which is coupled to said second reception filter is an array of a microstrip antenna as said first antenna and a slot antenna as said second antenna which are formed in the same plane and which are formed on the earth plate having the electric potential electrically common thereto; with respect to the element antennas of the microstrip antennas and the slot antennas constituting the array antenna, for the microstrip antennas, the resonance direction of those antennas matches the longitudinal direction of the array, i.e., the direction along which the array is formed, while for the slot antennas, the longitudinal direction as the resonance direction of the slots, or the longitudinal direction of the center portions when viewed along the direction of formation of the slots in the case where the slots are bent in shape at the ends thereof matches the longitudinal direction of the array, i.e., the direction along which the array is formed; the resonance direction of the slot antennas and the longitudinal direction of the slot center portions of the slot antennas are disposed approximately in the same straight line in all of the antennas constituting the array; and the microstrip antennas and the slot antennas are alternately arranged.

11. A system according to claim 9, wherein an array constituted by the antenna which is coupled to the common branch of said branch circuit of said automatic phase shift control feed forward transmission/reception unit and the second antenna which is coupled to said second reception filter is an array of a slot antenna as said first antenna and a microstrip antenna as said second antenna which are formed in the same plane and which are formed on the earth plate having the electric potential electrically common thereto; with respect to the element antennas of the microstrip antennas and the slot antennas constituting the array antenna, for the microstrip antennas, the resonance direction of those antennas matches the longitudinal direction of the array, i.e., the direction along which the array is formed, while for the slot antennas, the longitudinal direction as the resonance direction of the slots, or the longitudinal direction of the center portions when viewed along the direction of formation of the slots in the case where the slots are bent in shape at the ends thereof matches the longitudinal direction of the array, i.e., the direction along which the array is formed; the resonance direction of the slot antennas and the longitudinal direction of the slot center portions of the slot antennas are disposed approximately in the same straight line in all of the antennas constituting the array; and the microstrip antennas and the slot antennas are alternately arranged.

12. A system according to claim 8, wherein a part of or all of said first to fifth delay lines which said automatic phase shift control feed forward transmission/reception unit includes is/are replaced with a delay filter or delay filters.

13. A system according to claim 8, wherein said third combiner, said third splitter, said third variable phase shifter and variable attenuator, said fourth combiner, said fourth splitter, and said fourth variable phase shifter and variable attenuator are all removed, and the output terminal of said second combiner and the input terminal of said first splitter are directly coupled to the input terminal of said first splitter and the second input terminal of said sixth splitter, respectively.

14. A system according to claim 8, wherein said antennas which are coupled to the common branches of said branch circuits of said automatic phase shift control feed forward transmission/reception units constitute an array antenna.

15. A system according to claim 8, wherein said antennas which are coupled to the common branches of said branch circuits of said automatic phase shift control feed forward transmission/reception units constitute an array of microstrip antennas which are formed in the same plane and which are formed on the earth plate having the electric potential electrically common thereto; for the element antennas constituting the array antenna, the resonance direction of the element antennas matches the longitudinal direction of the array, i.e., the direction along which the array is formed; and the center lines of all of the antennas constituting the array which match the resonance direction of the element antennas are formed in the same straight line.

16. A system according to claim 15, wherein the size of the longitudinal direction matching the array direction of the element antennas is approximately half the wavelength of the carrier.

17. A system according to claim 8, wherein an array constituted by the antennas which are coupled to the common branches of said branch circuits of said automatic phase shift control feed forward transmission/reception units is an array of printed dipole antennas which are formed in the same plane and which are formed on a dielectric or a ceramic substrate; for the element antennas constituting the array antenna, the resonance direction of the element antennas matches the longitudinal direction of the array, i.e., the direction along which the array is formed; and the center lines of all of the antennas constituting the array which match the resonance direction of the element antennas are formed in the same straight line.

18. A system according to claim 8, wherein an array constituted by the antennas which are coupled to the common branches of said branch circuits of said automatic phase shift control feed forward transmission/reception units is an array of slot antennas which are formed in the same plane and which are formed on a dielectric or a ceramic substrate; for the element antennas constituting the array antenna, the resonance direction of the element antennas matches the longitudinal direction of the array, i.e., the direction along which the array is formed; and the center lines of all of the antennas constituting the array which match the resonance direction of the element antennas are formed in the same straight line.

19. A system according to claim 7, wherein said automatic phase shift control feed forward transmission/reception unit includes a second antenna; said branch circuit is removed; said first antenna is directly coupled to the output terminal of said transmission filter; and said second antenna is directly coupled to an input terminal of said reception filter.

20. A system according to claim 19, wherein said automatic phase shift control feed forward transmission/reception unit includes a second antenna, a fifth amplifier, and a second reception filter; said unit includes a second reception signal output terminal; an output terminal of said fifth amplifier is coupled to the second reception signal output terminal; and said second antenna is coupled to an input terminal of said fifth amplifier through said reception filter, thereby making the diversity reception possible.

21. A system according to claim 20, wherein an array constituted by said first antenna which is coupled to said transmission filter of said automatic phase shift control feed forward transmission/reception unit, said second antenna which is coupled to said first reception filter, and said third antenna which is coupled to said second reception filter is an array of microstrip antennas and slot antennas which are formed in the same plane and which are formed on the earth plate having an electric potential electrically common thereto; said first antenna and said second antennas are microstrip antennas, and said third antenna is the slot antenna; with respect to the element antennas of the microstrip antennas and the slot antennas constituting the array antenna, for the microstrip antennas, the resonance direction of those antennas matches the longitudinal direction of the array, i.e., the direction along which the array is formed, while for the slot antennas, the longitudinal direction as the resonance direction of the slots, or the longitudinal direction of the center portions when viewed along the direction of formation of the slots in the case where the slots are bent in shape at the ends thereof matches the longitudinal direction of the array, i.e., the direction along which the array is formed; said third antenna and said second antenna are arranged in parallel in such a way that the longitudinal direction of the slot center portion is parallel with the resonance direction thereof; the parallel arrangements of said second antenna and said third antenna, and said first antennas are disposed alternately; and the center line extending along the resonance direction of said first antenna, and the line segment which lies half-way between the center line extending along the resonance direction of the second antenna and the line segment the extending direction of which matches the longitudinal direction of the slot center portion of said third antenna, and which extends in the same direction as that of the center line and the line segment are disposed approximately in the same straight line.

22. A system according to claim 20, wherein an array constituted by said first antenna which is coupled to said transmission filter of said automatic phase shift control feed forward transmission/reception unit, said second antenna which is coupled to said first reception filter, and said third antenna which is coupled to said second reception filter is an array of slot antennas and microstrip antennas which are formed in the same plane and which are formed on the earth plate having an electric potential electrically common thereto; said first antenna and said second antennas are slot antennas, and said third antenna is the microstrip antenna; with respect to the element antennas of the microstrip antennas and the slot antennas constituting the array antenna, for the microstrip antennas, the resonance direction of those antennas matches the longitudinal direction of the array, i.e., the direction along which the array is formed, while for the slot antennas, the longitudinal direction as the resonance direction of the slots, or the longitudinal direction of the center portions when viewed along the direction of formation of the slots in the case where the slots are bent in shape at the ends thereof matches the longitudinal direction of the array, i.e., the direction along which the array is formed; said third antenna and said second antenna are arranged in parallel in such a way that the longitudinal direction of the slot center portion is parallel with the resonance direction thereof; the parallel arrangements of said second antenna and said third antenna, and said first antennas are disposed alternately; and the center line extending along the resonance direction of said first antenna, and the line segment which lies half-way between the center line extending along the resonance direction of the second antenna and the line segment the extending direction of which matches the longitudinal direction of the slot center portion of said third antenna, and which extends in the same direction as that of the center line and the line segment are disposed approximately in the same straight line.

23. A system according to claim 19, wherein an array constituted by said first antenna which is coupled to said transmission filter of said automatic phase shift control feed forward transmission/reception unit and said second antenna which is coupled to said reception antenna is an array of microstrip antennas which are formed in the same plane and which are formed on a dielectric or a ceramic substrate; for the element antennas constituting the array antenna, the resonance direction of the element antennas matches the longitudinal direction of the array, i.e., the direction along which the array is formed; and the center lines of all of the antennas constituting the array which match the resonance direction of the element antennas are formed in the same straight line; and the antennas coupled to said transmission filters and the antennas coupled to said reception filters are alternately arranged.

24. A system according to claim 19, wherein an array constituted by said first antenna which is coupled to said transmission filter of said automatic phase shift control feed forward transmission/reception unit and said second antenna which is coupled to said reception filter is an array of printed dipole antennas which are formed in the same plane and which are formed on a dielectric or a ceramic substrate; for the element antennas constituting the array antenna, the resonance direction of the element antennas matches the longitudinal direction of the array, along which the array is formed; and the center lines of all of the antennas constituting the array which match the resonance direction of the element antennas are formed in the same straight line; and the antennas coupled to said transmission filters and the antennas coupled to said reception filters are alternately arranged.

25. A system according to claim 19, wherein an array constituted by said first antenna which is coupled to said transmission filter of said automatic phase shift control feed forward transmission/reception unit and said second antenna which is coupled to said reception filter is an array of slot antennas which are formed in the same plane and which are formed on a dielectric or a ceramic substrate; for the element antennas constituting the array antenna, the resonance direction of the element antennas matches the longitudinal direction of the array, i.e., the direction along which the array is formed; and the center lines of all of the antennas constituting the array which match the resonance direction of the element antennas are formed in the same straight line; and the antennas coupled to said transmission filters and the antennas coupled to said reception filters are alternately arranged.

26. A system for transmitting an electrical signal, comprising:
 a plurality of transmission signal amplifiers each having a power amplifier, a variable phase shift circuit connected to an input portion of said power amplifier, a power detector connected to an output portion of said power amplifier, and a phase amount table which is constructed on the basis of the characteristics of said power amplifier;
 a plurality of antennas which are respectively connected to said plurality of transmission signal amplifiers;
 tilt angle control circuit having a plurality of control lines which are respectively connected to said plurality of transmission signal amplifiers; and a comparison control circuit for comparing an output of said power detector with a control signal of said tilt angle control circuit to generate a phase shift amount control signal on the basis of the contents of said phase shift amount table to supply the phase shift amount control signal to said variable phase shift circuit, thereby controlling an input transmission signal phase shift amount.

27. A transmission system according to claim 26, wherein said power amplifier is either a feed forward power amplifier or a linear power amplifier.

28. A system for transmitting/receiving a signal having a carrier frequency band for a radio base station, said system comprising a plurality of transmission/reception signal amplifying devices which are individually connected to a plurality of antennas constituting an array antenna and a tilt angle control circuit having a plurality of control lines, each of said transmission/reception signal amplifying devices comprising:

a power amplifier;

a variable phase shift circuit connected to an input portion of said power amplifier;

a power detector connected to an output portion of said power amplifier; and a phase shift amount control circuit for comparing an output of said power detector with a tilt angle control signal of said tilt angle control circuit to control the phase shift amount of said variable phase shift circuit on the basis of the comparison result and the contents of a phase shift amount table which is produced in relation to the characteristics of said power amplifier.

29. A system for transmitting/receiving a signal having a carrier frequency band for a radio base station, said system comprising a plurality of transmission/reception signal amplifying devices which are individually connected to a plurality of antennas constituting an array antenna and a plurality of tilt angle control circuits, each of said transmission/reception signal amplifying devices comprising:

a transmission power amplifier; and a variable phase shift circuit connected to an input portion of said transmission power amplifier for phase-shifting an input transmission signal in correspondence to the characteristics of said transmission power amplifier, wherein each of said transmission/reception signal amplifying devices is constructed in such a way as to take partial charge of the overall electric power which is to be radiated from said antennas into the air.

30. A system according to claim 29, wherein each of said transmission/reception signal amplifying devices comprises:

a power detector connected to an output portion of said transmission power amplifier; and a phase shift amount control circuit for comparing an output of said power detector with a tilt angle control signal of said tilt angle control circuit to control the phase shift amount of said variable phase shift circuit on the basis of the comparison result and the contents of a phase shift amount table which is produced in relation to the characteristics of said power amplifier.

* * * * *